US012564083B2

(12) United States Patent
Shi et al.

(10) Patent No.: US 12,564,083 B2
(45) Date of Patent: Feb. 24, 2026

(54) PACKAGING STRUCTURE HAVING SEMICONDUCTOR CHIPS AND ENCAPSULATION LAYERS AND FORMATION METHOD THEREOF

(71) Applicants: NANTONG TONGFU MICROELECTRONICS CO., LTD, Nantong (CN); TONGFU MICROELECTRONICS CO., LTD., Nantong (CN)

(72) Inventors: Lei Shi, Nantong (CN); Yujuan Tao, Nantong (CN); Ying Dai, Nantong (CN)

(73) Assignees: NANTONG TONGFU MICROELECTRONICS CO., LTD, Nantong (CN); TONGFU MICROELECTRONICS CO., LTD., Nantong (CN)

( * ) Notice: Subject to any disclaimer, the term of this patent is extended or adjusted under 35 U.S.C. 154(b) by 301 days.

(21) Appl. No.: 17/629,040

(22) PCT Filed: Jul. 17, 2020

(86) PCT No.: PCT/CN2020/102767
§ 371 (c)(1),
(2) Date: Jan. 21, 2022

(87) PCT Pub. No.: WO2021/013097
PCT Pub. Date: Jan. 28, 2021

(65) Prior Publication Data
US 2022/0278075 A1 Sep. 1, 2022

(30) Foreign Application Priority Data

Jul. 24, 2019 (CN) .......................... 201910675798.2
Jul. 25, 2019 (CN) .......................... 201910675802.5
(Continued)

(51) Int. Cl.
*H01L 23/00* (2006.01)
*H01L 21/56* (2006.01)

(52) U.S. Cl.
CPC ............ *H01L 24/96* (2013.01); *H01L 21/565* (2013.01); *H01L 24/11* (2013.01); *H01L 24/16* (2013.01);
(Continued)

(58) Field of Classification Search
CPC . H01L 21/565; H01L 21/6835; H01L 21/561; H01L 21/568; H01L 21/56;
(Continued)

(56) References Cited

U.S. PATENT DOCUMENTS 10,522,501 B2 * 12/2019 Tsai .................... H01L 23/5383
10,522,526 B2 * 12/2019 Lai ...................... H01L 21/6836
(Continued)

FOREIGN PATENT DOCUMENTS

CN 102856279 A 1/2013
CN 102956468 A 3/2013
(Continued)

OTHER PUBLICATIONS

World Intellectual Property Organization (WIPO) International Search Report for PCT/CN2020/102767 Oct. 21, 2020 5 Pages.

*Primary Examiner* — Khiem D Nguyen
(74) *Attorney, Agent, or Firm* — Anova Law Group, PLLC

(57) ABSTRACT

A packaging structure and a formation method thereof are provided. The packaging structure includes a carrier board, and a plurality of semiconductor chips adhered to the carrier board. Each semiconductor chip has a functional surface and a non-functional surface opposite to the functional surface, and a plurality of pads are formed on the functional surface of a semiconductor chip of the plurality of chips. A metal
(Continued)

bump is formed on a surface of a pad of the plurality of pads, and a first encapsulation layer is formed on the functional surface. The packaging structure also includes a second encapsulation layer formed over the carrier board.

20 Claims, 14 Drawing Sheets

(30)          Foreign Application Priority Data

| Jul. 25, 2019 | (CN) | .......................... | 201910675804.4 |
| Jul. 25, 2019 | (CN) | .......................... | 201910676041.5 |
| Jul. 25, 2019 | (CN) | .......................... | 201910676042.X |
| Jul. 25, 2019 | (CN) | .......................... | 201910676061.2 |

(52) U.S. Cl.
CPC .............. *H01L 24/27* (2013.01); *H01L 24/29* (2013.01); *H01L 24/32* (2013.01); *H01L 24/73* (2013.01); *H01L 24/97* (2013.01); *H01L 2224/11009* (2013.01); *H01L 2224/16225* (2013.01); *H01L 2224/27845* (2013.01); *H01L 2224/2919* (2013.01); *H01L 2224/32225* (2013.01); *H01L 2224/73204* (2013.01); *H01L 2924/182* (2013.01); *H01L 2924/186* (2013.01)

(58) Field of Classification Search
CPC ......... H01L 24/11; H01L 24/16; H01L 24/27; H01L 24/29; H01L 24/32; H01L 24/73; H01L 24/96; H01L 24/97; H01L 2224/11009; H01L 2224/16225; H01L 2224/27845; H01L 2224/2919; H01L 2224/32225; H01L 2224/73204; H01L 2224/92244; H01L 2224/04105; H01L 2224/12105

See application file for complete search history.

(56)          References Cited

U.S. PATENT DOCUMENTS

| 10,586,724 | B2 * | 3/2020 | Hu | ....................... | H01L 21/6835 |
| 10,978,408 | B2 * | 4/2021 | Chang Chien | ...... | H01L 23/3128 |
| 11,075,145 | B2 * | 7/2021 | Yu | .......................... | H01L 23/481 |
| 2005/0253261 | A1 * | 11/2005 | Farnworth | .......... | H01L 23/3114 257/734 |
| 2010/0244277 | A1 * | 9/2010 | Huang | ..................... | H01L 24/19 257/E23.116 |
| 2013/0168848 | A1 * | 7/2013 | Lin | .......................... | H01L 24/20 257/737 |
| 2016/0071818 | A1 * | 3/2016 | Wang | ...................... | H01L 24/49 257/773 |
| 2016/0086825 | A1 | 3/2016 | Scanlan et al. | | |
| 2019/0006339 | A1 * | 1/2019 | Lau | ..................... | H01L 23/3675 |
| 2019/0096840 | A1 * | 3/2019 | Ang | ......................... | H01L 24/24 |
| 2019/0172803 | A1 * | 6/2019 | Chen | ..................... | H01L 21/566 |
| 2020/0135567 | A1 * | 4/2020 | Tu | ....................... | H01L 23/3107 |

FOREIGN PATENT DOCUMENTS

| CN | 103187388 | A | 7/2013 |
| CN | 106971997 | A | 7/2017 |
| CN | 107039362 | A | 8/2017 |
| CN | 108231606 | A | 6/2018 |
| CN | 207938809 | U | 10/2018 |
| CN | 109659292 | A | 4/2019 |
| CN | 109727953 | A | 5/2019 |
| CN | 110504174 | A | 11/2019 |
| CN | 110517959 | A | 11/2019 |
| CN | 110534440 | A | 12/2019 |
| CN | 110534441 | A | 12/2019 |
| CN | 110534483 | A | 12/2019 |
| CN | 110534484 | A | 12/2019 |

* cited by examiner

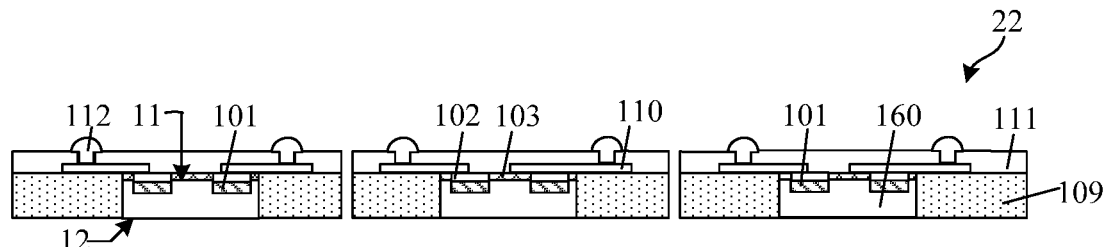
Figure 56
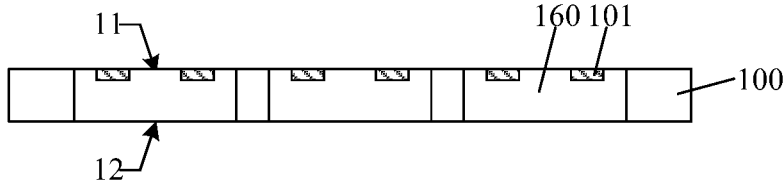
Figure 57
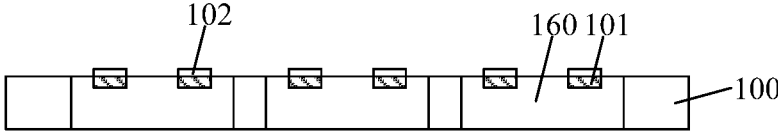
Figure 58
Figure 59
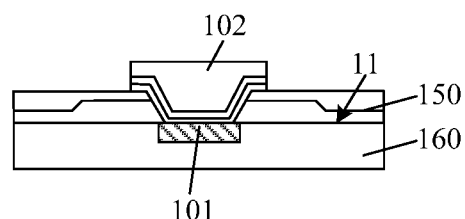
Figure 60

PACKAGING STRUCTURE HAVING SEMICONDUCTOR CHIPS AND ENCAPSULATION LAYERS AND FORMATION METHOD THEREOF

CROSS-REFERENCES TO RELATED APPLICATIONS

This application is a national phase entry under 35 U. S. C § 371 of International Application No. PCT/CN2020/102767, filed on Jul. 17, 2020, which claims the priority of Chinese patent applications No. 201910676041.5, filed on Jul. 25, 2019; No. 201910676061.2, filed on Jul. 25, 2019; No. 201910676042.X, filed on Jul. 25, 2019; No. 201910675804.4, filed on Jul. 25, 2019; No. 201910675802.5, filed on Jul. 25, 2019; and No. 201910675798.2, filed on Jul. 25, 2019, the entirety of all of which is incorporated herein by reference.

FIELD OF THE DISCLOSURE

The present disclosure generally relates to the field of semiconductor manufacturing and, more particularly, relates to a fan-out packaging structure and formation method thereof.

BACKGROUND

The chip fan-in packaging is a manufacturing method of performing a rewiring process and forming a solder ball bump on an entire wafer, and ultimately cutting the wafer to form a plurality of separate chips. The ultimate packaging size of such kind of packaging is equal to the chip size, which may achieve the miniaturization and light weight of the packaging, and has a substantially wide range of applications in portable devices. Although the chip fan-in packaging can greatly reduce the size of the packaged chip, a quantity of placed balls on a single chip is limited, and, thus, such wafer packaging is difficult to apply to a chip with high-density I/O ports. Therefore, for the chip with a substantially high density I/O ports, if wafer-level packaging is performed to ensure that the chip to be packaged is interconnected with the printed circuit board, high-density I/O ports have to be fanned out as low-density packaging pins. In other words, the chip fan-out packaging needs to be performed. Compared with the conventional chip fan-in packaging, the chip fan-out packaging can obtain a substantially small packaging size, desired electrical and thermal performance, and a substantially high packaging density.

At present, the chip fan-out packaging mainly includes: first, adhering a front surface (the front surface is a surface on which a pad is formed) of each semiconductor chip of the plurality of divided semiconductor chips to a carrier board through an adhesive tape or an adhesive layer; forming an encapsulation layer on the carrier board to cover the semiconductor chip, where the plurality of semiconductor chips on the carrier board may be encapsulated; peeling off the carrier board; performing a rewiring process on the front surface of the semiconductor chip to form a rewiring layer connected to the pad; forming a tin ball connected to the rewiring layer on the rewiring layer; and ultimately forming the plurality of discrete packaging structures by performing a cutting process.

However, in the packaging structure formed by the existing chip fan-out packaging process, the electrical connection between the rewiring layer and the semiconductor chip tends to be unstable, which affects the performance of the packaging structure. The disclosed packaging structure and formation method are directed to solve one or more problems set forth above and other problems in the art.

BRIEF SUMMARY OF THE DISCLOSURE

One aspect of the present disclosure includes a packaging structure. The packaging structure includes a carrier board, and a plurality of semiconductor chips adhered to the carrier board. Each semiconductor chip has a functional surface and a non-functional surface opposite to the functional surface, and a plurality of pads are formed on the functional surface of a semiconductor chip of the plurality of chips. A metal bump is formed on a surface of a pad of the plurality of pads, and a first encapsulation layer is formed on the functional surface. The packaging structure also includes a second encapsulation layer formed over the carrier board.

Another aspect of the present disclosure includes a method for forming a packaging structure. The method includes providing a plurality of semiconductor chips. Each semiconductor chip of the plurality of semiconductor chips includes a functional surface and a non-functional surface opposite to the functional surface. A plurality of pads are formed on the functional surface, and a metal bump is formed on a surface of a pad of the plurality of pads. A first encapsulation layer is formed on the functional surface. The method also includes providing a carrier board, and adhering the first encapsulation layer on the functional surface of the each semiconductor chip to the carrier board. In addition, the method includes forming a second encapsulation layer on the carrier board to cover the non-functional surface and a sidewall surface of a semiconductor chip of the plurality of semiconductor chips. Moreover, the method includes forming a pre-encapsulation panel by peeling off the carrier board. A back side of the pre-encapsulation panel exposes the first encapsulation layer. Further, the method includes removing a portion of the first encapsulation layer and the second encapsulation layer on the back side of the pre-encapsulation panel to expose a top surface of the metal bump. Furthermore, the method includes forming an external contact structure connected to the metal bump on the back side of the pre-encapsulation panel.

Another aspect of the present disclosure includes a method for forming a packaging structure. The method includes providing a plurality of semiconductor chips. Each semiconductor chip of the plurality of semiconductor chips includes a functional surface and a non-functional surface opposite to the functional surface. A plurality of pads are formed on the functional surface, and a metal bump is formed on a surface of a pad of the plurality of pads. A first encapsulation layer is formed on the functional surface. The method also includes providing a carrier board, and adhering the non-functional surface of the each semiconductor chip to the carrier board. In addition, the method includes forming a second encapsulation layer on the carrier board to cover the first encapsulation layer on the functional surface, and a sidewall surface of a semiconductor chip of the plurality of semiconductor chips. Moreover, the method includes removing a portion of the first encapsulation layer and the second encapsulation layer over the carrier board by a planarization process to expose a top surface of the metal bump. Further, the method includes forming an external contact structure connected to the metal bump on a surface of the planarized first encapsulation layer and the second encapsulation layer, and peeling off the carrier board.

The present disclosure has the following beneficial effects. In the disclosed embodiments of the present disclosure, the packaging structure may include the plurality semiconductor chips adhered to the carrier board. A plurality of pads may be formed on the functional surface of the semiconductor chip, and the metal bump may be formed on the surface of the pad. The first encapsulation layer may be formed over the functional surface. In one embodiment, the first encapsulation layer may cover the metal bump. In another embodiment, the first encapsulation layer may be coplanar with the top surface of the metal bump. The first encapsulation layer on the functional surface of the semiconductor chip may be adhered to the carrier board. The packaging structure may also include a second encapsulation layer formed on the carrier board and covering the nonfunctional surface and the sidewall surface of the semiconductor chip.

Because the first encapsulation layer may often be formed by an injection molding process or a transfer process, the first encapsulation layer may have a flat surface. Therefore, each semiconductor chip may have a flat surface. When adhering the first encapsulation layer on each discrete semiconductor chip to the carrier board, a substantially high adhesive force may be between each semiconductor chip and the carrier board. When forming the second encapsulation layer on the carrier board to cover the plurality of semiconductor chips, the position of each semiconductor chip on the carrier board may not be shifted when subjected to the pressure impact of injection molding or transfer molding. After the carrier board is subsequently removed to form the pre-encapsulation panel, when forming the rewiring layer connected to the pad on the back side of the pre-encapsulation panel, the connection position of the rewiring layer and the corresponding pad may not be shifted, thereby improving the electrical connection performance between the rewiring layer and the pad, and improving the stability and reliability of the packaging structure.

In addition, before forming the first encapsulation layer, the isolation sacrificial layer may be formed on the top surface or the top and sidewall surfaces of the metal bump, and then the first encapsulation layer may be formed to cover the isolation sacrificial layer. A portion of the first encapsulation layer and the second encapsulation layer may be removed by combined chemical mechanical polishing process and etching process to expose the metal bump. In one embodiment, a portion of the first encapsulation layer and the second encapsulation layer may be removed by a chemical mechanical polishing process to expose the surface of the isolation sacrificial layer, and then the isolation sacrificial layer on the top surface of the metal bump may be removed by an etching process to expose the top surface of the metal bump.

Therefore, through the combination of the aforementioned specific structure and specific process, not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump may be prevented from being loosened or coming off from the pad, which may further improve the accuracy of the connection position of the subsequently formed rewiring layer and the corresponding metal bump, and may further improve the electrical connection performance between the rewiring layer and the metal bump.

Moreover, the semiconductor chip may be formed by an integrated manufacturing process. A wafer may be provided, and the plurality of semiconductor chips may be formed on the wafer. Each semiconductor chip may include the functional surface, and the plurality of pads may be formed on the functional surface. The metal bump may be formed on the pad. The first encapsulation layer may be formed to cover the metal bump and the functional surface by an injection molding process or a transfer molding process. After forming the first encapsulation layer, the wafer may be cut to form the plurality of discrete semiconductor chips.

When performing the injection molding process or transfer molding process, the bottom of the wafer may be fixed in the mold. Due to the large area of the bottom of the wafer, the wafer may not move in the mold of the injection molding or transfer molding equipment, such that the formed first encapsulation layer may have a flat surface. After cutting the wafer, each semiconductor chip of the plurality of formed discrete semiconductor chips may have a flat surface, and the thickness of each semiconductor chip may be kept consistent. When subsequently adhering the first encapsulation layer on each semiconductor chip to the carrier board, because the first encapsulation layer has a flat surface, a substantially high adhesive force may be between each semiconductor chip and the carrier board.

Further, the size of the material particle in the first encapsulation layer may be smaller than the size of the material particle in the subsequently formed second encapsulation layer, such that the first encapsulation layer may substantially well fill gaps between the metal bumps and on both sides of the metal bump. The contact between the first encapsulation layer and the side of the metal bump may be substantially tight, and the first encapsulation layer may have a desired fixing effect for the metal bump. When subsequently planarizing the first encapsulation layer and the second encapsulation layer by a chemical mechanical polishing process to expose the top surface of the metal bump, the metal bump may be prevented from being loosened or coming off from the pad, and may be prevented from being over-polished.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

FIGS. 39-56 illustrate schematic diagrams of semiconductor structures corresponding to certain stages of another exemplary method for forming a packaging structure consistent with various disclosed embodiments of the present disclosure; and FIGS. 57-74 illustrate schematic diagrams of semiconductor structures corresponding to certain stages of another exemplary method for forming a packaging structure consistent with various disclosed embodiments of the present disclosure.

DETAILED DESCRIPTION

Figure 1:
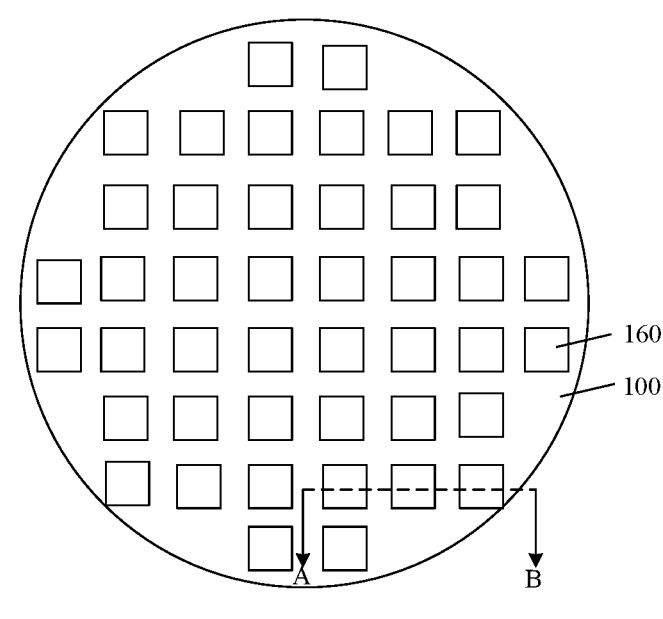
FIGS. 1-19 illustrate schematic diagrams of semiconductor structures corresponding to certain stages of an exemplary method for forming a packaging structure consistent with various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

In the packaging structure formed by a chip fan-out packaging process, the electrical connection between the rewiring layer and the semiconductor chip tends to be unstable, and the reason thereof includes that a connection position of the rewiring layer and the pad of the semiconductor chip is shifted.

The reason why the connection position of the rewiring layer and the pad of the semiconductor chip is shifted includes following. When performing a fan-out packaging, the surface of the semiconductor chip with the pad is adhered to the carrier board by an adhesive tape or an adhesive layer. Because different semiconductor chip has a different surface flatness, especially when a metal bump is formed on the pad, the difference in surface flatness of different semiconductor chip is substantially large. Therefore, when the different semiconductor chip is adhered to the carrier board by an adhesive tape or an adhesive layer, the adhesive force between the different semiconductor chip and the carrier board is different. When forming the encapsulation layer, due to insufficient adhesive force, position of a certain semiconductor chip on the carrier board is shifted under the action of injection molding pressure or impact force.

Alternatively, when performing the fan-out packaging, the non-functional surface of the semiconductor chips (the surface on which the pad is not formed) is adhered to the carrier board by an adhesive tape or an adhesive layer. Then, an encapsulation layer is formed on the carrier board by an injection molding process or a transfer molding process to cover the semiconductor chip. The encapsulation layer is planarized by a chemical mechanical polishing process to expose the top surface of the metal bump on the pad of the semiconductor chip. Because a thickness of each semiconductor chip on the carrier board is thick, the metal bump on the semiconductor chip protrudes from the functional surface. Except for the bottom part contacting the pad, the protruded portion of the metal bump is suspended in the injection mold. Therefore, substantially high steps are between the semiconductor chip and the carrier board and between the semiconductor chips. In addition, the particle size of the material of the encapsulation layer is substantially large, and the injection pressure is substantially great.

When forming the encapsulation layer by an injection molding process or a transfer molding process, the metal bump tends to be detached or shifted from the surface of the pad under the action of injection molding pressure or transfer molding pressure, and holes or gap defects are easily formed between the formed encapsulation layer and the metal bump. The encapsulation layer near the metal bump has a density and hardness different from the encapsulation layer in any other position. The fixing effect of the encapsulation layer on the metal bump is weakened. When planarizing the encapsulation layer by a chemical mechanical polishing process to expose the top surface of the metal bump on the pad of the semiconductor chip, the metal bump also tends to be detached or shifted from the surface of the pad, and tends to be over-polished.

Therefore, after the carrier board is removed, when forming the rewiring layer on the encapsulation layer and on the front surface of the semiconductor chip, the connection position of the rewiring layer and the pad on the semiconductor chip with a position offset is shifted, which affects the electrical connection performance between the rewiring layer and the pad in the formed fan-out packaging structure.

The present disclosure provides a packaging structure and a method for forming the packaging structure. To clearly illustrate the above objects, features and advantages of the present disclosure, the specific embodiments of the present disclosure may be described in detail with reference to the accompanying drawings. For illustrative purposes, the schematic diagram may be partially enlarged not according to a general scale, and the schematic diagram is merely an example, which may not tend to limit the protection scope of the present disclosure. In addition, the actual production may include the three-dimensional dimensions of length, width and depth.

Exemplary Embodiment 1

FIGS. 1-19 illustrate schematic diagrams of semiconductor structures corresponding to certain stages of a method for forming a packaging structure consistent with various disclosed embodiments of the present disclosure. Referring to FIGS. 1-6, a plurality of semiconductor chips 160 (referring to FIG. 6) may be provided. Each semiconductor chip 160 may have a functional surface 11 and a non-functional surface 12 opposite to the functional surface 11. A plurality of pads 101 may be formed on the functional surface 11. A metal bump 102 may be formed on a surface of a pad 101 of the plurality of pads 101. A first encapsulation layer 103 may be formed over the functional surface 11, and the first encapsulation layer 103 may cover the metal bump 102.

The semiconductor chip 160 may have the functional surface 11 and the non-functional surface 12 opposite to the functional surface 11. The functional surface of the semiconductor chip may be a surface where an integrated circuit and the plurality of pads are formed. The integrated circuit may be formed in the semiconductor chip 160. The plurality of pads 101 may be formed on the functional surface of the semiconductor chip 160. The pad 101 may be electrically connected to the integrated circuit in the semiconductor chip 160. The pad 101 may serve as a port for the integrated circuit in the semiconductor chip 160 to be electrically connected to an external circuit.

In one embodiment, the integrated circuit in the semiconductor chip 160 may include a plurality of semiconductor devices (e.g., transistor, memory, sensor, diode and/or triode, etc.) and an interconnection structure (including metal wire and metal plug) for connecting the semiconductor devices. The surrounding surface between the functional surface 11 and the non-functional surface 12 of the semiconductor chip 160 may be the sidewall of the semiconductor chip 160.

The semiconductor chip 160 may be formed by a semiconductor integrated manufacturing process. The detailed process of forming the semiconductor chip 160 may be described in detail below with reference to FIGS. 1-6. FIG.

Figure 2:
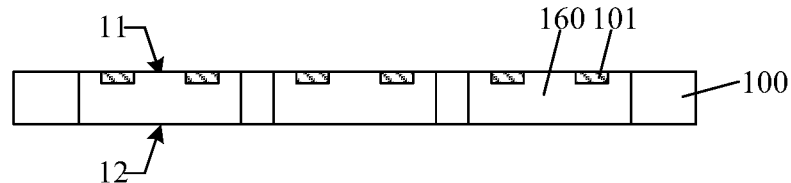

2 illustrates a schematic AB sectional view of a semiconductor structure in FIG. 1. Referring to FIG. 1 and FIG. 2, a wafer 100 may be provided. The wafer 100 may include a plurality of chip regions arranged in rows and columns and a scribe-line region between the chip regions. The plurality of chip regions of the wafer 100 may be used for correspondingly forming the plurality of semiconductor chips 160. The plurality of pads 101 may be formed on the functional surface of the semiconductor chip 160.

In one embodiment, the wafer 100 may be monocrystalline silicon (Si), monocrystalline germanium (Ge), silicon germanium (GeSi), or silicon carbide (SiC). In another embodiment, the wafer may be silicon on insulator (SOI), or germanium on insulator (GOI). In certain embodiments, the wafer may be any other suitable material, e.g., Group III-V compounds, such as *allium* arsenide (GaAs), etc. The pad may be made of one of aluminum, nickel, tin, tungsten, platinum, copper, and titanium.

Figure 3:
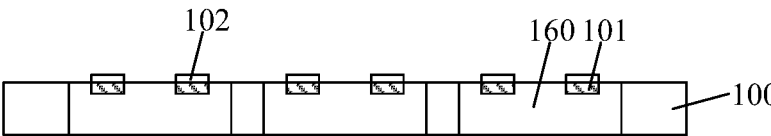
Figure 4:
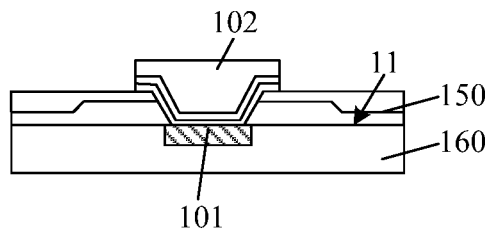

FIG. 4 illustrates an enlarged schematic diagram of a metal bump formed on the pad in FIG. 3. Referring to FIG. 3 and FIG. 4, a metal bump 102 may be formed on the surface of the pad 101.

The metal bump 102 may protrude from the surface of the pad 101 and the functional surface. In one embodiment, the material of the metal bump 102 may include one or more of aluminum, nickel, tin, tungsten, platinum, copper, titanium, chromium, tantalum, gold and silver. The metal bump 102 may raise the pad 101 to facilitate subsequent wiring, may protect the pad, and may provide a thermal dissipation path.

In one embodiment, the process of forming the metal bump 102 may include following. An insulating layer 150 may be formed on the functional surface 11 of the semiconductor chip 160. The insulating layer 150 may have a first opening exposing a portion of the surface of the pad 101. The insulating layer 150 may have a single-layer or multi-layer stacked structure. The material of the insulating layer 150 may include one or more of silicon nitride, silicon oxide, and resin. An under-bump metal (UBM) layer may be formed on the surface of the insulating layer 150 and on the sidewall and bottom surfaces of the first opening. The UBM layer may have a single-layer or multi-layer stacked structure. A mask layer having a second opening may be formed on the UBM layer. The second opening may at least expose the surface of the UBM layer in the first opening. The metal bump 102 may be formed in the second opening by an electroplating process. The mask layer may be removed, and the UBM layer on the surface of the insulating layer on both sides of the metal bump 102 may be removed by etching.

Figure 5:
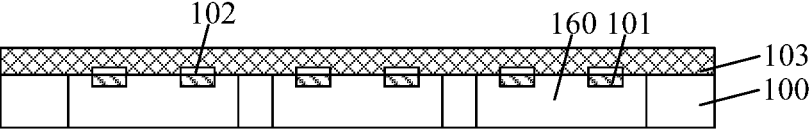

Referring to FIG. 5, a first encapsulation layer 103 may be formed on the surface of the wafer 100 (the functional surface of the semiconductor chip 160). The first encapsulation layer 103 may cover the metal bump 102.

The first encapsulation layer 103 may cover the top and sidewall surfaces of the metal bump 102. The first encapsulation layer 103 may have a flat surface, and the process of forming the first encapsulation layer 103 may include an injection molding process or a transfer molding process. The first encapsulation layer 103 may be made of resin. The resin may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol.

In one embodiment, when performing the injection molding process or transfer molding process, the bottom of the wafer 100 may be fixed in the mold. Due to the large area of the bottom of the wafer, the wafer may not move in the mold of the injection molding or transfer molding equipment, such that the formed first encapsulation layer 103 may have a flat surface. After cutting the wafer, each semiconductor chip of the plurality of formed discrete semiconductor chips 160 may have a flat surface, and the thickness of each semiconductor chip 160 may be kept consistent. When subsequently adhering the first encapsulation layer 103 on each semiconductor chip 160 to the carrier board, because the first encapsulation layer 103 has a flat surface, a substantially high adhesive force may be between each semiconductor chip 160 and the carrier board.

Therefore, when subsequently forming a second encapsulation layer on the carrier board to cover the plurality of semiconductor chips 160, the position of each semiconductor chip 160 on the carrier board may not be shifted when subjected to the pressure impact of injection molding or transfer molding. After the carrier board is subsequently removed to form a pre-encapsulation panel, when forming a rewiring layer connected to the pad on the back side of the pre-encapsulation panel, the connection position of the rewiring layer and the corresponding pad may not be shifted, thereby improving the electrical connection performance between the rewiring layer and the pad, and improving the stability and reliability of the packaging structure.

In addition, the formed first encapsulation layer 103 may be used to fix the metal bump 102. When subsequently planarizing the first encapsulation layer and the second encapsulation layer, the metal bump 102 may be subjected to lateral grinding force, while may be prevented from being loosened or coming off from the pad 101.

The formed first encapsulation layer 103 may also be used to protect the metal bump 102, and may prevent the metal bump 102 from being contaminated or damaged in subsequent processes.

In one embodiment, the size of the material particle in the first encapsulation layer 103 may be smaller than the size of the material particle in the subsequently formed second encapsulation layer, such that the first encapsulation layer 103 may substantially well fill gaps between the metal bumps 102 and on both sides of the metal bump 102. The contact between the first encapsulation layer 103 and the side of the metal bump 102 may be substantially tight, and the first encapsulation layer 103 may have a desired fixing effect for the metal bump 102. When subsequently planarizing the first encapsulation layer and the second encapsulation layer by a chemical mechanical polishing process to expose the top surface of the metal bump 102, the metal bump 102 may be prevented from being loosened or coming off from the pad 101, and may be prevented from being over-polished.

Figures 6, 7, 8, 9, 10, 11:
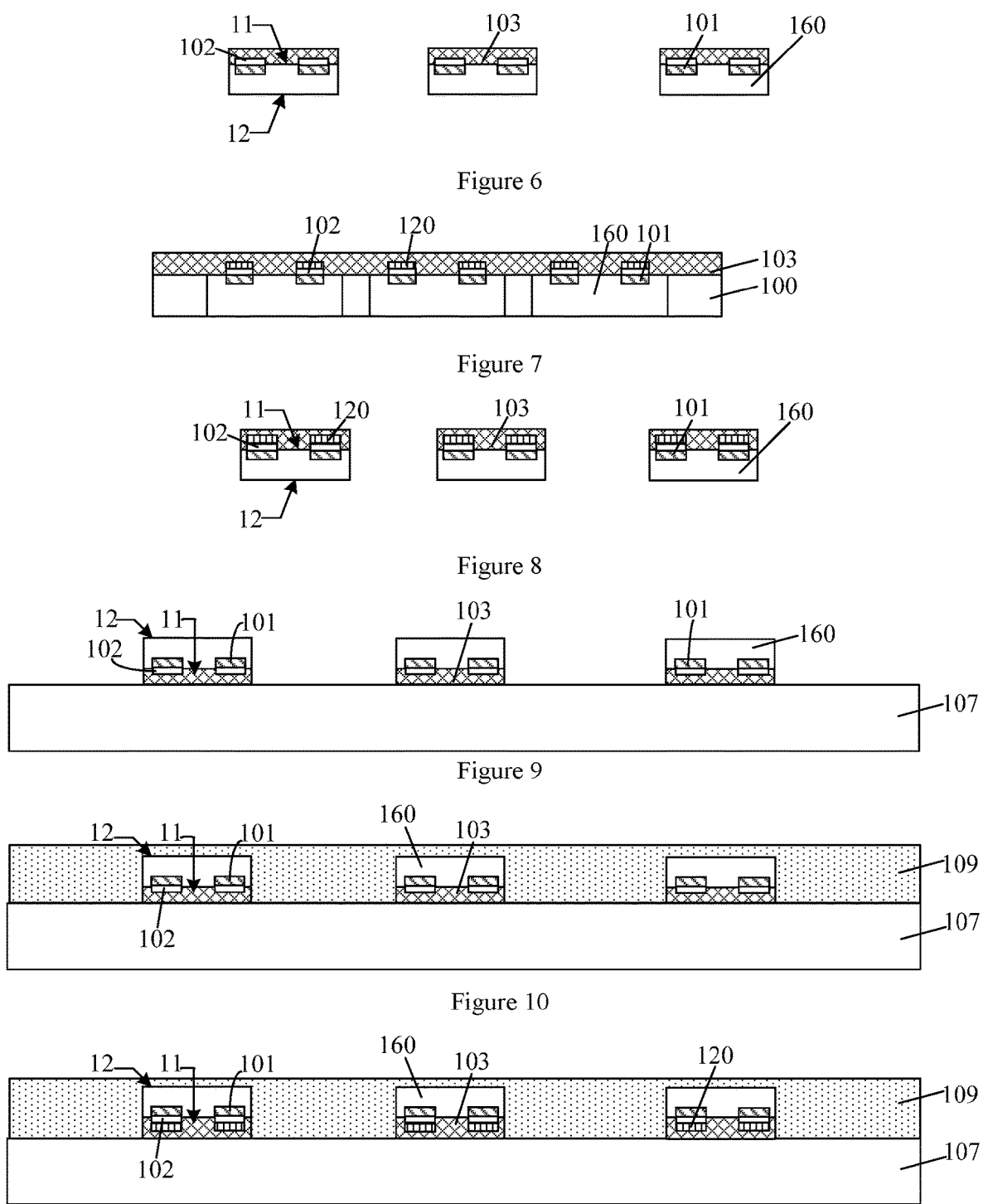

Referring to FIG. 6, the wafer 100 (referring to FIG. 5) may be cut along the scribe-line region to form a plurality of discrete semiconductor chips 160 having the first encapsulation layer 103.

In certain embodiments, referring to FIG. 7, after forming the metal bump 102 and before forming the first encapsulation layer 103, an isolation sacrificial layer 120 may be formed on the top surface or on the top and sidewall surfaces of the metal bump 102. After forming the isolation sacrificial layer 120, the first encapsulation layer 103 may be formed to cover the isolation sacrificial layer 120 and the semiconductor chip 160.

If the formed first encapsulation layer 103 directly covers the surface of the metal bump 102, after subsequently forming the second encapsulation layer covering the nonfunctional surface and the sidewall surface of the semiconductor chip and peeling off the carrier board, a portion of the first encapsulation layer and the second encapsulation layer may need to be removed by a planarization process (chemical mechanical polishing process) to expose the top surface of the metal bump 102. During the planarization process (chemical mechanical polishing process), the polishing force may be likely to cause certain metal bump 102 to be loosened or come off from the pad 101.

Therefore, in the present disclosure, before forming the first encapsulation layer 103, the isolation sacrificial layer 120 may be formed on the top surface or the top and sidewall surfaces of the metal bump 102. A portion of the first encapsulation layer 103 and the second encapsulation layer may be removed by combined chemical mechanical polishing process and etching process to expose the metal bump. In one embodiment, the chemical mechanical polishing process may be first used to remove a portion of the first encapsulation layer and the second encapsulation layer to expose the surface of the isolation sacrificial layer, and then the isolation sacrificial layer on the top surface of the metal bump 102 may be removed by an etching process to expose the top surface of the metal bump.

Not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position of the subsequently formed rewiring layer and the corresponding metal bump, and may further improve the electrical connection performance between the rewiring layer and the metal bump 102.

In addition, the formed isolation sacrificial layer 120 may also improve the adhesive force between the first encapsulation layer 103 and the metal bump 102. In one embodiment, the material of the isolation sacrificial layer 120 may include silicon oxide, silicon nitride, or silicon oxynitride.

Referring to FIG. 8, the wafer 100 (referring to FIG. 7) may be cut along the scribe-line region to form a plurality of discrete semiconductor chips 160 having the isolation sacrificial layer 120 and the first encapsulation layer 103.

Referring to FIG. 9 or FIG. 11, a carrier board 107 may be provided. The first encapsulation layer 103 on the functional surface of each semiconductor chip 160 may be adhered to the carrier board 107. The carrier board 107 may provide a supporting platform for subsequent processes. In one embodiment, the carrier board 107 may be a glass carrier board, a silicon carrier board, or a metal carrier board. In another embodiment, the carrier board may be a carrier board made of any other suitable material.

The first encapsulation layer 103 on the semiconductor chip 160 may be adhered to the surface of the carrier board 107 by an adhesive layer. The functional surface (or the pad 101) of the semiconductor chip 160 may face toward an adhesive surface of the carrier board 107. The plurality of semiconductor chips 160 may be uniformly adhered to the carrier board 107 in rows and columns.

The adhesive layer may be made of various materials. In one embodiment, the adhesive layer may be made of an UV glue. The UV glue may be a kind of glue material that can be reacted under irradiation of ultraviolet light of special wavelength. The UV glue may be divided into two types according to the change in viscosity after irradiation of ultraviolet light. One kind of the UV glue may be an UV curing glue, that is, the photoinitiator or photosensitizer in the material may absorb ultraviolet light under radiation of ultraviolet light to produce active radicals or cations, which may initiate monomer polymerization, cross-linking and graft chemical reactions to enable the UV curing glue to change from liquid to solid within a few seconds, thereby bonding the surfaces of objects being in contact. Another kind of the UV glue may have substantially high viscosity when not exposed to UV light, and after being exposed to ultraviolet light, the cross-linking chemical bonds in the UV glue may be broken, which may cause the viscosity to significantly decrease or even disappear. The UV glue used for the adhesive layer here may be the latter one. The adhesive layer may be formed by a film-sticking process, a glue-printing process, or a glue-rolling process.

In certain embodiments, the adhesive layer may be made of epoxy glue, polyimide glue, polyethylene glue, benzocyclobutene glue, or polybenzoxazole glue.

Referring to FIG. 10 or FIG. 11, a second encapsulation layer 109 may be formed on the carrier board 107 to cover the non-functional surface and the sidewall surface of the semiconductor chip 160.

The second encapsulation layer 109 may be used to seal and fix the semiconductor chip 160, which may facilitate to subsequently form a pre-encapsulation panel. The second encapsulation layer 109 may also cover the surface of the carrier board 107 and the sidewall surface of the first encapsulation layer 103.

The material of the second encapsulation layer 109 may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol. The second encapsulation layer 109 may be formed by an injection molding process, a transfer molding process, or any other suitable process.

When forming the second encapsulation layer 109, due to the presence of the first encapsulation layer 103, each semiconductor chip 160 may have a flat surface. When adhering the first encapsulation layer 103 on each discrete semiconductor chip 160 to the carrier board, because the first encapsulation layer 103 has a flat surface, a substantially high adhesive force may be between each semiconductor chip 160 and the carrier board. Therefore, when subsequently forming the second encapsulation layer 109 on the carrier board 170 to cover the plurality of semiconductor chips 160, the position of each semiconductor chip 160 on the carrier board may not be shifted when subjected to the pressure impact of injection molding or transfer molding. After the carrier board is subsequently removed to form a pre-encapsulation panel, when forming the rewiring layer connected to the pad on the back side of the pre-encapsulation panel, the connection position of the rewiring layer and the corresponding pad may not be shifted, thereby improving the electrical connection performance between the rewiring layer and the pad, and improving the stability and reliability of the packaging structure.

Figure 12:
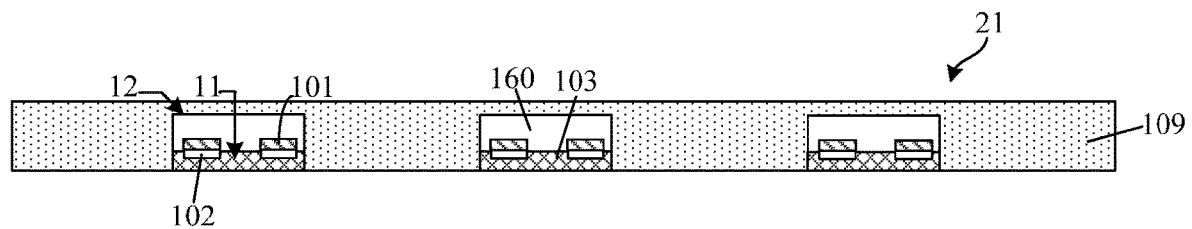
Figure 13:
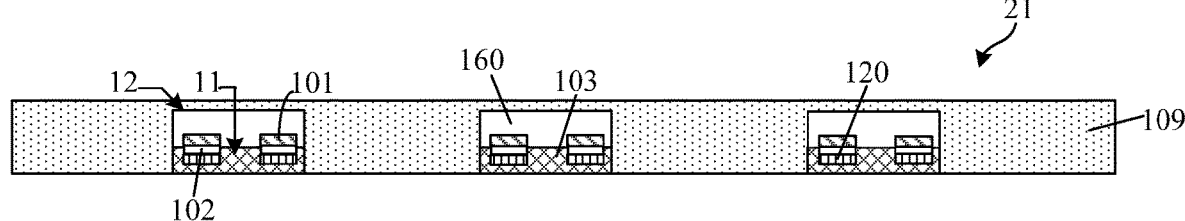

Referring to FIG. 12 (on the basis of FIG. 10) or FIG. 13 (on the basis of FIG. 11), the carrier board 107 may be peeled off (referring to FIG. 10 or FIG. 11) to form a pre-encapsulation panel 21. The back side of the pre-encapsulation panel 21 may expose the first encapsulation layer 103.

The adhesive layer may be removed by chemical etching, mechanical peeling, chemical mechanical polishing (CMP), mechanical grinding, thermal baking, etc., such that the carrier board 107 may be peeled off.

Figure 14:
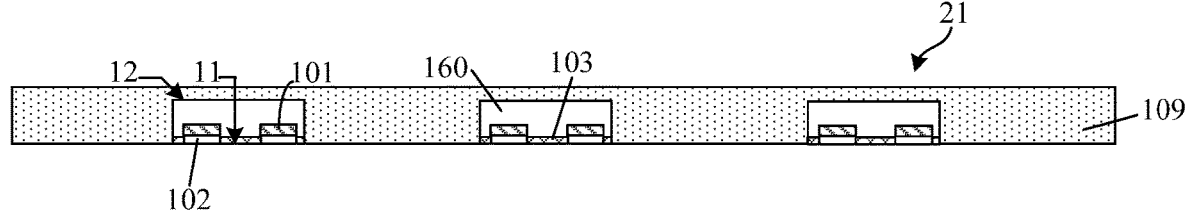
Figure 15:
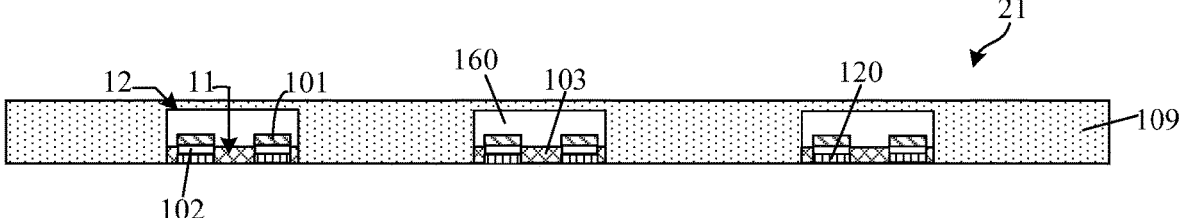
Figure 16:
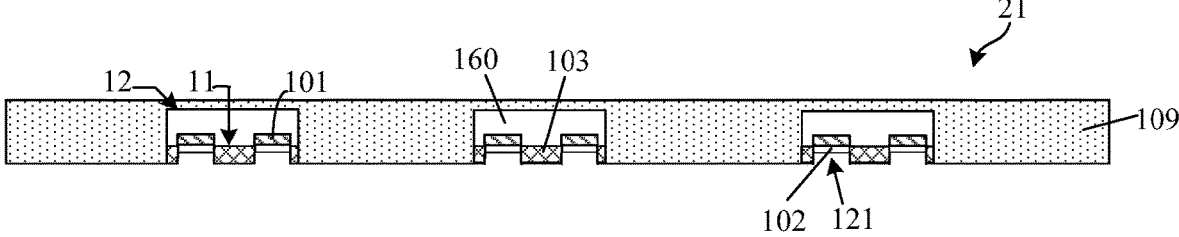

Referring to FIG. 14 (on the basis of FIG. 12) or in combination with FIG. 15 (on the basis of FIG. 14) and FIG. 16 (on the basis of FIG. 15), a portion of the first encapsulation layer 103 and the second encapsulation layer 109 on the back side of the pre-encapsulation panel 21 may be removed to expose the top surface of the metal bump 102.

In one embodiment, when the isolation sacrificial layer is not formed, the portion of the first encapsulation layer 103 and the second encapsulation layer 109 on the back side of the pre-encapsulation panel 21 may be directly removed by a chemical mechanical polishing process to expose the metal bump 102.

In another embodiment, when the isolation sacrificial layer 120 is formed, referring to FIG. 15, the portion of the first encapsulation layer 103 and the second encapsulation layer 109 may be first removed by a chemical mechanical polishing process to expose the surface of the isolation sacrificial layer 120. Referring to FIG. 16, the isolation sacrificial layer 120 (referring to FIG. 15) on the top surface of the metal bump 102 may be removed by an etching process to expose the top surface of the metal bump 102.

In one embodiment, an opening 121 in the first encapsulation layer 103 may be formed at a corresponding position for removing the isolation sacrificial layer 120, and the opening 121 may expose the top surface of the metal bump 102. In the present disclosure, by forming the isolation sacrificial layer 120, the portion of the first encapsulation layer and the second encapsulation layer may be removed by a chemical mechanical polishing process to expose the surface of the isolation sacrificial layer. The isolation sacrificial layer on the top surface of the metal bump 102 may be removed by an etching process to expose the top surface of the metal bump 102.

Therefore, through the combination of the aforementioned specific structure and specific process, not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position between the subsequently formed rewiring layer and the corresponding metal bump, and may further improve the electrical connection performance between the rewiring layer and the metal bump 102.

The etching process for removing the isolation sacrificial layer 120 may include a wet etching process or a dry etching process. In one embodiment, when the isolation sacrificial layer 120 is made of silicon nitride, the isolation sacrificial layer 120 may be removed by a wet etching process, and an etching solution used in the wet etching process may include a phosphoric acid solution.

Figure 17:
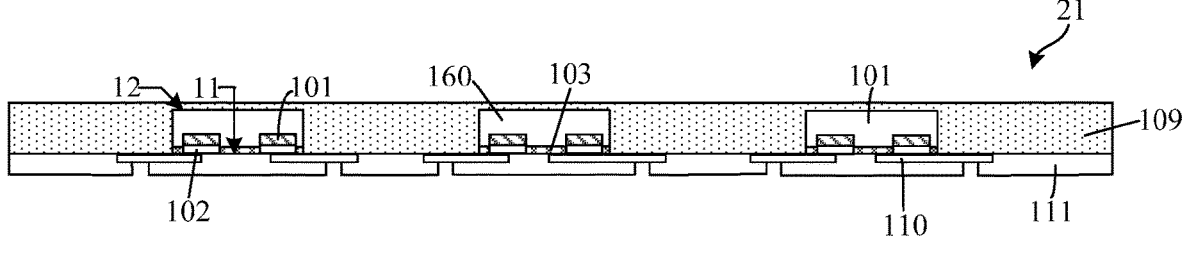
Figure 18:
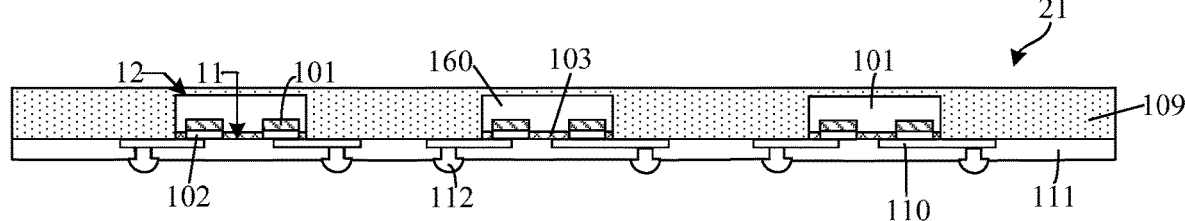

Referring to FIG. 17 and FIG. 18, an external contact structure connected to the metal bump 102 may be formed on the back side of the pre-encapsulation panel 21. The external contact structure may include a rewiring layer 110 located on the back side of the pre-encapsulation panel 21 and connected to the metal bump 102, and an external contact element 112 located on the rewiring layer 110 and connected to the rewiring layer 110. The metal bump 102 on each semiconductor chip 160 may be connected to a corresponding external contact structure. In one embodiment, the external contact element 112 may be a solder ball. In another embodiment, the external contact element 112 may include a metal pillar and a solder ball located on the surface of the metal pillar.

In one embodiment, the process of forming the rewiring layer 110 and the external contact element 112 may include following. After peeling off the carrier board, the rewiring layer 110 may be formed on the back side of the pre-encapsulation panel 21. An insulating layer 111 may be formed on the rewiring layer 110 and the back side of the pre-encapsulation panel 21. The insulating layer 111 may have an opening that exposes a partial surface of the rewiring layer 110. The material of the insulating layer 111 may include silicon nitride, borosilicate glass, phosphorous silicate glass, or borophosphosilicate glass. The external contact element 112 may be formed in the opening.

Figure 19:
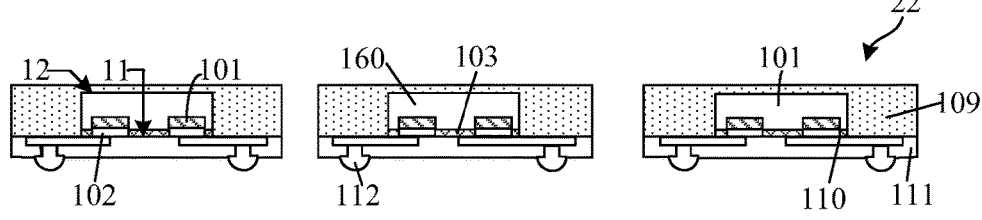

Referring to FIG. 19, after forming the external contact structure, the pre-encapsulation panel may be cut to form a plurality of discrete packaging structures 22.

It should be noted that the process of forming the external contact structure on the basis of FIG. 16 may be substantially the same as the process of forming the external contact structure in FIGS. 17-18, and details may not be repeated herein.

Exemplary Embodiment 2

The present disclosure also provides a packaging structure. Referring to FIG. 10 or FIG. 11, the packaging structure may include a carrier board 107 and a plurality of semiconductor chips 160 adhered to the carrier board 107. Each semiconductor chip 160 may have a functional surface 11 and a non-functional surface 12 opposite to the functional surface 11. A plurality of pads 101 may be formed on the functional surface 11. A metal bump 102 may be formed on the surface of a pad 101 of the plurality of pads 101. A first encapsulation layer 103 may be formed over the functional surface 11. The first encapsulation layer 103 may cover the metal bump 102. The first encapsulation layer 103 on the functional surface of the semiconductor chip 160 may be adhered to the carrier board 107.

The packaging structure may also include a second encapsulation layer 109 formed on the carrier board 107 and covering the non-functional surface and the sidewall surface of the semiconductor chip 160.

In one embodiment, the semiconductor chip 160 may be formed by an integrated manufacturing process. A wafer may be provided, and the plurality of semiconductor chips may be formed on the wafer. Each semiconductor chip may include the functional surface, and the plurality of pads may be formed on the functional surface. The metal bump may be formed on the pad. The first encapsulation layer may be formed to cover the metal bump and the functional surface. After forming the first encapsulation layer, the wafer may be cut to form the plurality of discrete semiconductor chips.

In one embodiment, the material of the first encapsulation layer 103 and the second encapsulation layer 109 may include resin. The process of forming the first encapsulation layer and the second encapsulation layer may include an injection molding process or a transfer molding process.

In one embodiment, the size of the material particle in the first encapsulation layer 103 may be smaller than the size of the material particle in the second encapsulation layer 109.

In one embodiment, referring to FIG. 11, the packaging structure may also include an isolation sacrificial layer 120 formed on the top surface or the top and sidewall surfaces of the metal bump 102. The first encapsulation layer 103 may further cover the isolation sacrificial layer 120. The material of the isolation sacrificial layer 120 may include silicon oxide, silicon nitride, or silicon oxynitride.

It should be noted that the same or similar structures of the packaging structure may not be repeated herein, and details may refer to the definitions or descriptions of corresponding parts in the method of forming the packaging structure.

Exemplary Embodiment 3

FIGS. 20-38 illustrate schematic diagrams of semiconductor structures corresponding to certain stages of a method for forming a packaging structure consistent with various disclosed embodiments of the present disclosure. Referring to FIGS. 20-26, a plurality of semiconductor chips 160 (referring to FIG. 26) may be provided. Each semiconductor chip 160 may have a functional surface 11 and a non-functional surface 12 opposite to the functional surface 11. A plurality of pads 101 may be formed on the functional surface 11. A metal bump 102 may be formed on a surface of a pad 101 of the plurality of pads 101. A first encapsulation layer 103 may be formed over the functional surface 11, and a top surface of the first encapsulation layer 103 may be coplanar with a top surface the metal bump 102.

The semiconductor chip 160 may have the functional surface 11 and the non-functional surface 12 opposite to the functional surface 11. The functional surface of the semiconductor chip may be a surface where an integrated circuit and the plurality of pads are formed. The integrated circuit may be formed in the semiconductor chip 160. The plurality of pads 101 may be formed on the functional surface of the semiconductor chip 160. The pad 101 may be electrically connected to the integrated circuit in the semiconductor chip 160. The pad 101 may serve as a port for the integrated circuit in the semiconductor chip 160 to be electrically connected to an external circuit.

In one embodiment, the integrated circuit in the semiconductor chip 160 may include a plurality of semiconductor devices (e.g., transistor, memory, sensor, diode and/or triode, etc.) and an interconnection structure (including metal wire and metal plug) for connecting the semiconductor devices. The surrounding surface between the functional surface 11 and the non-functional surface 12 of the semiconductor chip 160 may be the sidewall of the semiconductor chip 160.

Figure 20:
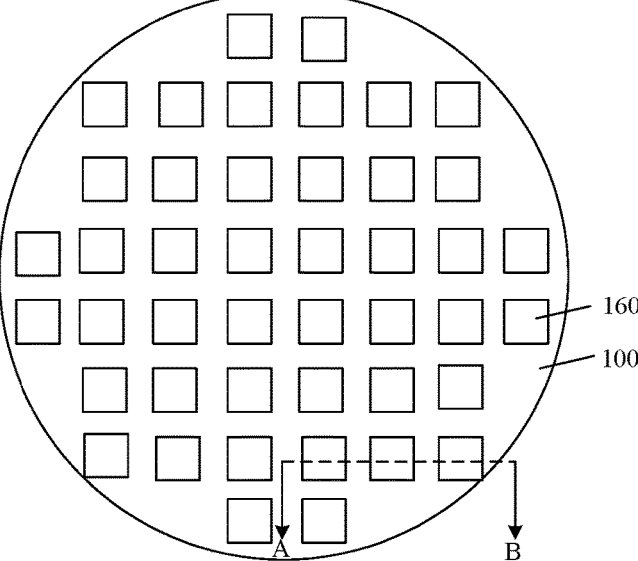
FIGS. 20-38 illustrate schematic diagrams of semiconductor structures corresponding to certain stages of another exemplary method for forming a packaging structure consistent with various disclosed embodiments of the present disclosure.
Figure 21:
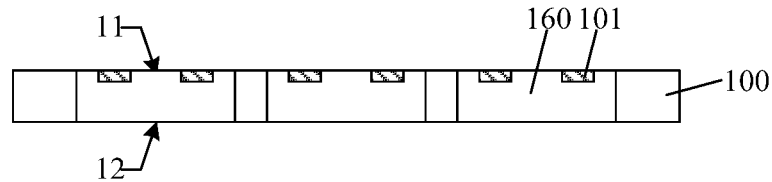

The semiconductor chip 160 may be formed by a semiconductor integrated manufacturing process. The detailed process of forming the semiconductor chip 160 may be described in detail below with reference to FIGS. 20-26. FIG. 21 illustrates a schematic AB sectional view of a semiconductor structure in FIG. 20. Referring to FIG. 20 and FIG. 21, a wafer 100 may be provided. The wafer 100 may include a plurality of chip regions arranged in rows and columns and a scribe-line region between the chip regions. The plurality of chip regions of the wafer 100 may be used for correspondingly forming the plurality of semiconductor chips 160. The plurality of pads 101 may be formed on the functional surface of the semiconductor chip 160.

In one embodiment, the wafer 100 may be monocrystalline silicon (Si), monocrystalline germanium (Ge), silicon germanium (GeSi), or silicon carbide (SiC). In another embodiment, the wafer may be silicon on insulator (SOI), or germanium on insulator (GOI). In certain embodiments, the wafer may be any other suitable material, e.g., Group III-V compounds, such as *allium* arsenide (GaAs), etc. The pad may be made of one of aluminum, nickel, tin, tungsten, platinum, copper, and titanium.

Figure 22:
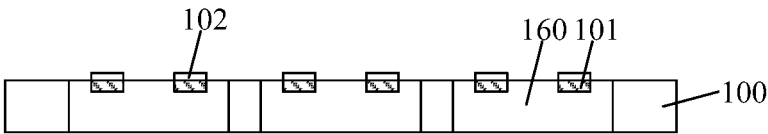
Figure 23:
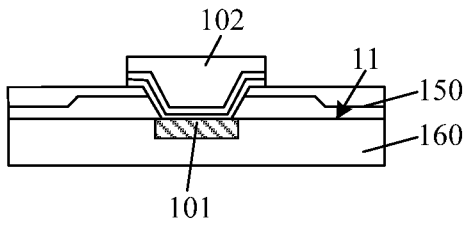

FIG. 23 illustrates an enlarged schematic diagram of a metal bump formed on the pad in FIG. 22. Referring to FIG. 22 and FIG. 23, a metal bump 102 may be formed on the surface of the pad 101.

The metal bump 102 may protrude from the surface of the pad 101 and the functional surface. In one embodiment, the material of the metal bump 102 may include one or more of aluminum, nickel, tin, tungsten, platinum, copper, titanium, chromium, tantalum, gold and silver. The metal bump 102 may raise the pad 101 to facilitate subsequent wiring, may protect the pad, and may provide a thermal dissipation path.

In one embodiment, the process of forming the metal bump 102 may include following. An insulating layer 150 may be formed on the functional surface 11 of the semiconductor chip 160. The insulating layer 150 may have a first opening exposing a portion of the surface of the pad 101. The insulating layer 150 may have a single-layer or multi-layer stacked structure. The material of the insulating layer 150 may include one or more of silicon nitride, silicon oxide, and resin. An under-bump metal (UBM) layer may be formed on the surface of the insulating layer 150 and on the sidewall and bottom surfaces of the first opening. The UBM layer may have a single-layer or multi-layer stacked structure. A mask layer having a second opening may be formed on the UBM layer. The second opening may at least expose the surface of the UBM layer in the first opening. The metal bump 102 may be formed in the second opening by an electroplating process. The mask layer may be removed, and the UBM layer on the surface of the insulating layer on both sides of the metal bump 102 may be removed by etching.

Figure 24:
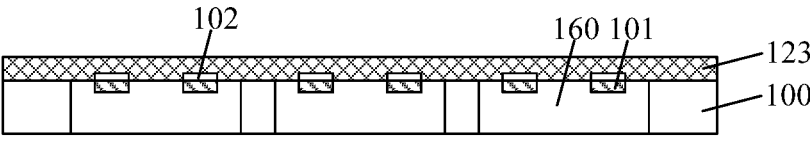

Referring to FIG. 24, a first encapsulation material layer 123 may be formed on the surface of the wafer 100 (the functional surface of the semiconductor chip 160). The first encapsulation material layer 123 may cover the metal bump 102.

The first encapsulation material layer 123 may cover the top and sidewall surfaces of the metal bump 102. The first encapsulation material layer 123 may have a flat surface, and the process of forming the first encapsulation material layer 123 may include an injection molding process or a transfer molding process. The first encapsulation layer 103 may be made of resin. The resin may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol.

In one embodiment, when performing the injection molding process or transfer molding process, the bottom of the wafer 100 may be fixed in the mold. Due to the large area of the bottom of the wafer, the wafer may not move in the mold of the injection molding or transfer molding equipment, such that the formed first encapsulation material layer 123 may have a flat surface. When subsequently planarizing the first encapsulation material layer 123 to expose the top surface of the metal bump 102, the remaining first encapsulation material layer may form a first encapsulation layer 103. The first encapsulation layer 103 may also have a flat surface. After cutting the wafer, each semiconductor chip of the plurality of formed discrete semiconductor chips 160 may have a flat surface, and the thickness of each semiconductor chip 160 may be kept consistent. When subsequently adhering the first encapsulation layer 103 and the pad on each semiconductor chip 160 to the carrier board, because the first encapsulation layer 103 has a flat surface, a substantially high adhesive force may be between each semiconductor chip 160 and the carrier board.

Therefore, when subsequently forming a second encapsulation layer on the carrier board to cover the plurality of semiconductor chips 160, the position of each semiconductor chip 160 on the carrier board may not be shifted when subjected to the pressure impact of injection molding or transfer molding. After the carrier board is subsequently removed to form a pre-encapsulation panel, when forming a rewiring layer connected to the pad on the back side of the pre-encapsulation panel, the connection position of the rewiring layer and the corresponding pad may not be shifted, thereby improving the electrical connection performance between the rewiring layer and the pad, and improving the stability and reliability of the packaging structure.

In addition, the formed first encapsulation layer 103 may be used to fix the metal bump 102. When subsequently planarizing the first encapsulation material layer, the metal bump 102 may be prevented from being loosened or coming off from the pad 101.

The formed first encapsulation layer 103 may also be used to protect the metal bump 102, and may prevent the metal bump 102 from being contaminated or damaged in subsequent processes.

In one embodiment, the size of the material particle in the first encapsulation layer 103 may be smaller than the size of the material particle in the subsequently formed second encapsulation layer, such that the first encapsulation layer 103 may substantially well fill gaps between the metal bumps 102 and on both sides of the metal bump 102. The contact between the first encapsulation layer 103 and the side of the metal bump 102 may be substantially tight, and the first encapsulation layer 103 may have a desired fixing effect for the metal bump 102.

Figure 25:
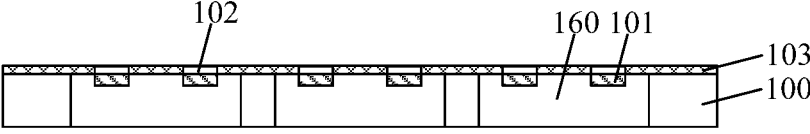

Referring to FIG. 25, the first encapsulation material layer may be planarized to expose the top surface of the metal bump 102. The remaining first encapsulation material layer may form the first encapsulation layer 103. The top surface of the first encapsulation layer 103 may be coplanar with the top surface of the metal bump 102. The first encapsulation material layer may be planarized by a chemical mechanical polishing process.

Figure 26:
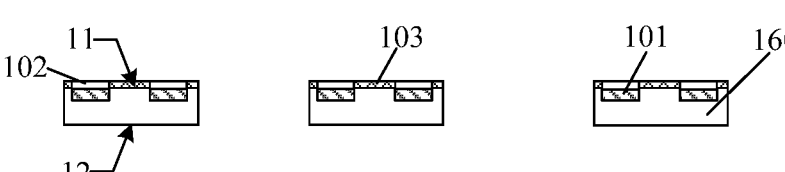

Referring to FIG. 26, after forming the first encapsulation layer 103, the wafer 100 (referring to FIG. 25) may be cut along the scribe-line region to form a plurality of discrete semiconductor chips 160 having the first encapsulation layer 103.

Figure 27:
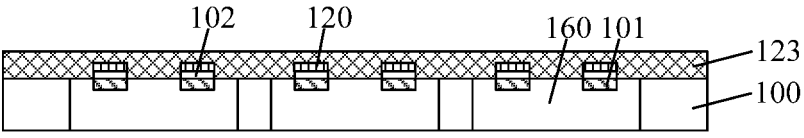

In certain embodiments, referring to FIG. 27, the formed metal bump 102 may also include an isolation sacrificial layer 120 formed on the top surface or on the top and sidewall surfaces of the metal bump 102. After forming the isolation sacrificial layer 120, the first encapsulation material layer 123 may be formed to cover the isolation sacrificial layer 120 and the semiconductor chip 160.

Figures 28, 29, 30, 31, 32, 33:
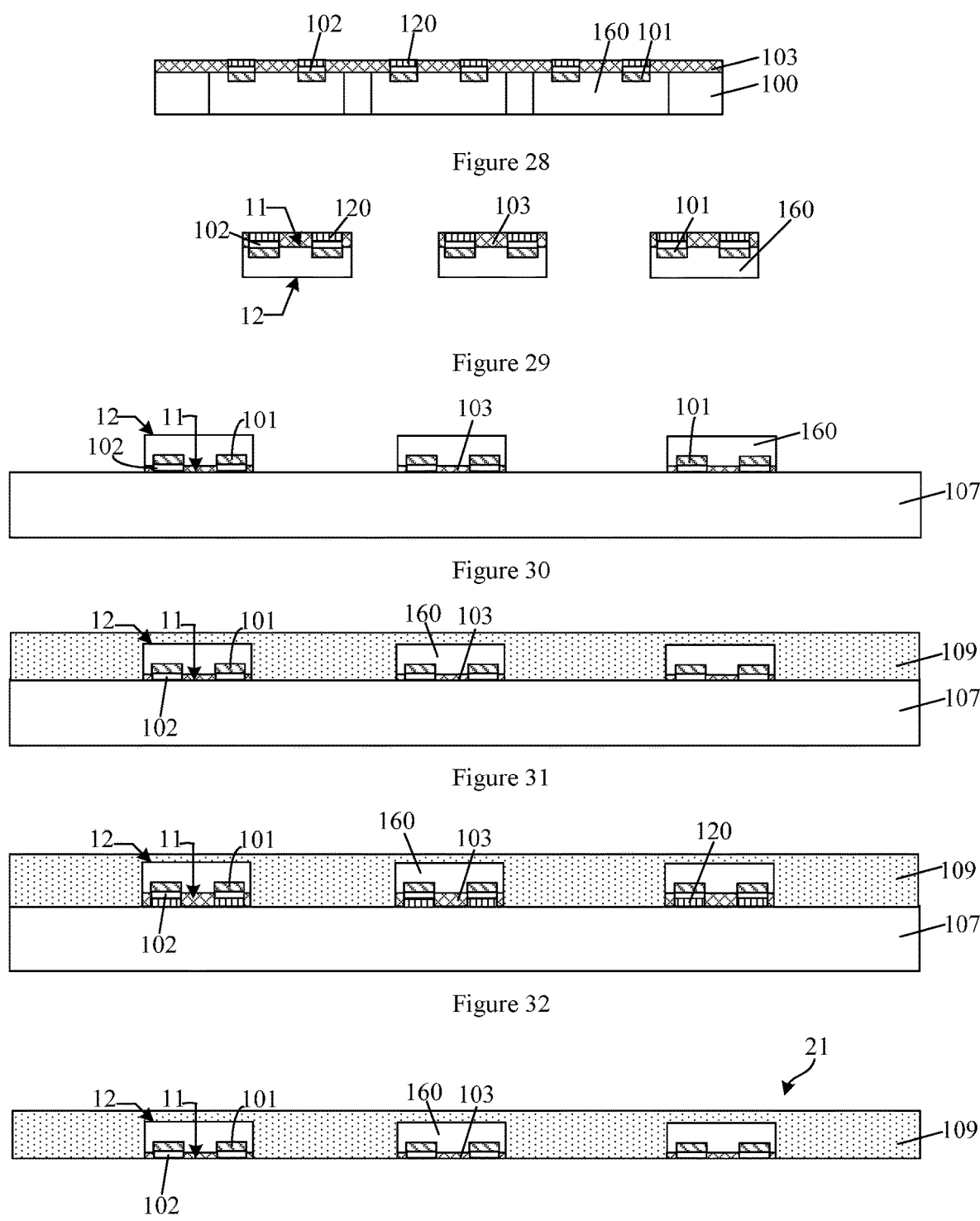

Referring to FIG. 28, the first encapsulation material layer 123 may be planarized to expose the surface of the isolation sacrificial layer 120. The remaining first encapsulation material layer may form the first encapsulation layer 103. The top surface of the first encapsulation layer 103 may be coplanar with the top surface of the isolation sacrificial layer 120 on the metal bump.

Referring to FIG. 29, after forming the first encapsulation layer 103, the wafer may be cut to form a plurality of discrete semiconductor chips 160.

If the formed first encapsulation material layer 123 directly covers the top surface of the metal bump 102, when removing a portion of the first encapsulation material layer 123 by a planarization process (chemical mechanical polishing process) to expose the top surface of the metal bump 102, during the process of planarizing (chemical mechanical polishing process) the first encapsulation material layer 123, the polishing force may be likely to cause certain metal bump 102 to be loosened or come off from the pad 101.

Therefore, in the present disclosure, before forming the first encapsulation material layer 123, the isolation sacrificial layer 120 may be formed on the top surface or the top and sidewall surfaces of the metal bump 102. The isolation sacrificial layer 120 may be a part of the metal bump 102. A portion of the first encapsulation material layer 123 and the isolation sacrificial layer 120 may be removed by combined chemical mechanical polishing process and subsequently etching process to expose the metal bump. In one embodiment, the chemical mechanical polishing process may be first used to remove a portion of the first encapsulation material layer to expose the surface of the isolation sacrificial layer. The remaining first encapsulation material layer may form the first encapsulation layer. The isolation sacrificial layer on the top surface of the metal bump 102 may be removed by an etching process to expose the top surface of the metal bump.

Not only the top surface of the metal bump may be exposed, but also when removing the portion of the first encapsulation material layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position of the subsequently formed rewiring layer and the corresponding metal bump, and may further improve the electrical connection performance between the rewiring layer and the metal bump 102.

In addition, the formed isolation sacrificial layer 120 may also improve the adhesive force between the first encapsulation layer 103 and the metal bump 102. In one embodiment, the material of the isolation sacrificial layer 120 may include silicon oxide, silicon nitride, or silicon oxynitride.

Referring to FIG. 29, the wafer 100 (referring to FIG. 28) may be cut along the scribe-line region to form a plurality of discrete semiconductor chips 160 having the isolation sacrificial layer 120 and the first encapsulation layer 103.

Referring to FIG. 30 or FIG. 32, a carrier board 107 may be provided. The first encapsulation layer 103 and the pad 101 on the functional surface of each semiconductor chip 160 may be adhered to the carrier board 107. The carrier board 107 may provide a supporting platform for subsequent processes. In one embodiment, the carrier board 107 may be a glass carrier board, a silicon carrier board, or a metal carrier board. In another embodiment, the carrier board may be a carrier board made of any other suitable material.

The first encapsulation layer 103 and the pad 101 on the semiconductor chip 160 may be adhered to the surface of the carrier board 107 by an adhesive layer. The functional surface (or the pad 101) of the semiconductor chip 160 may face toward an adhesive surface of the carrier board 107. The plurality of semiconductor chips 160 may be uniformly adhered to the carrier board 107 in rows and columns.

The adhesive layer may be made of various materials. In one embodiment, the adhesive layer may be made of an UV glue. The UV glue may be a kind of glue material that can be reacted under irradiation of ultraviolet light of special wavelength. The UV glue may be divided into two types according to the change in viscosity after irradiation of ultraviolet light. One kind of the UV glue may be an UV curing glue, that is, the photoinitiator or photosensitizer in the material may absorb ultraviolet light under radiation of ultraviolet light to produce active radicals or cations, which may initiate monomer polymerization, cross-linking and graft chemical reactions to enable the UV curing glue to change from liquid to solid within a few seconds, thereby bonding the surfaces of objects being in contact. Another kind of the UV glue may have substantially high viscosity when not exposed to UV light, and after being exposed to ultraviolet light, the cross-linking chemical bonds in the UV glue may be broken, which may cause the viscosity to significantly decrease or even disappear. The UV glue used for the adhesive layer here may be the latter one. The adhesive layer may be formed by a film-sticking process, a glue-printing process, or a glue-rolling process.

In certain embodiments, the adhesive layer may be made of epoxy glue, polyimide glue, polyethylene glue, benzocyclobutene glue, or polybenzoxazole glue.

Referring to FIG. 31 or FIG. 32, a second encapsulation layer 109 may be formed on the carrier board 107 to cover the non-functional surface and the sidewall surface of the semiconductor chip 160.

The second encapsulation layer 109 may be used to seal and fix the semiconductor chip 160, which may facilitate to subsequently form a pre-encapsulation panel. The second encapsulation layer 109 may also cover the surface of the carrier board 107 and the sidewall surface of the first encapsulation layer 103.

The material of the second encapsulation layer 109 may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol. The second encapsulation layer 109 may be formed by an injection molding process, a transfer molding process, or any other suitable process.

When forming the second encapsulation layer 109, due to the presence of the first encapsulation layer 103, each semiconductor chip 160 may have a flat surface. When adhering the first encapsulation layer 103 on each discrete semiconductor chip 160 to the carrier board, because the first encapsulation layer 103 has a flat surface, a substantially high adhesive force may be between each semiconductor chip 160 and the carrier board. Therefore, when subsequently forming the second encapsulation layer 109 on the carrier board 170 to cover the plurality of semiconductor chips 160, the position of each semiconductor chip 160 on the carrier board may not be shifted when subjected to the pressure impact of injection molding or transfer molding. After the carrier board is subsequently removed to form a pre-encapsulation panel, when forming the rewiring layer connected to the pad on the back side of the pre-encapsulation panel, the connection position of the rewiring layer and the corresponding pad may not be shifted, thereby improving the electrical connection performance between the rewiring layer and the pad, and improving the stability and reliability of the packaging structure.

Figure 34:
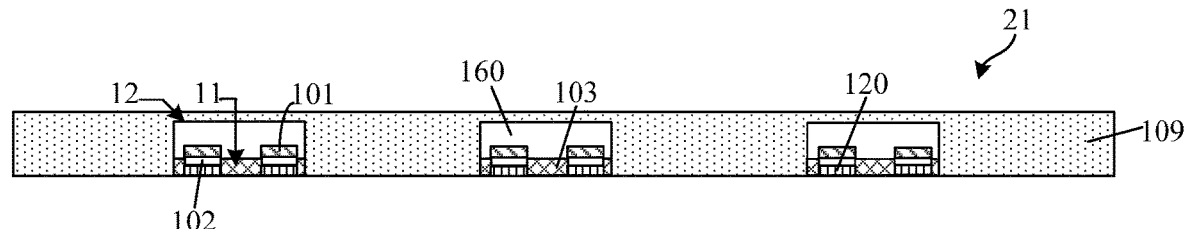
Figure 35:
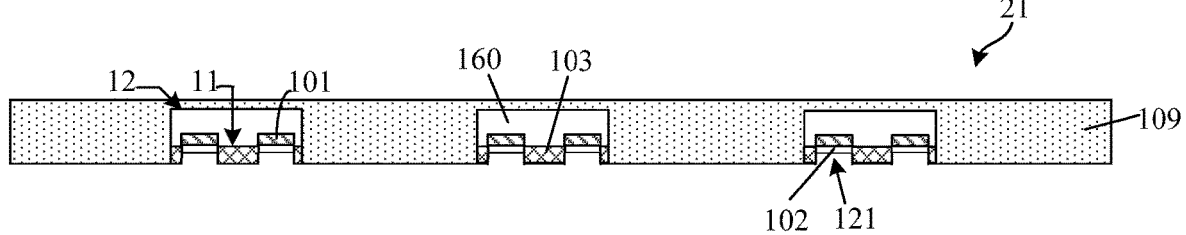

Referring to FIG. 33 (on the basis of FIG. 31) or in combination with FIG. 34 (on the basis of FIG. 32) and FIG. 35 (on the basis of FIG. 34), the carrier board 107 may be peeled off (referring to FIG. 31 or FIG. 32) to form a pre-encapsulation panel 21. The back side of the pre-encapsulation panel 21 may expose the first encapsulation layer 103 and the pad 101.

The adhesive layer may be removed by chemical etching, mechanical peeling, chemical mechanical polishing (CMP), mechanical grinding, thermal baking, etc., such that the carrier board 107 may be peeled off.

In one embodiment, when the isolation sacrificial layer is not formed, after peeling off the carrier board, the metal bump 102 may be directly exposed.

In another embodiment, when the isolation sacrificial layer 120 is formed, referring to FIG. 34, the carrier board may be peeled off to expose the surface of the isolation sacrificial layer 120. Referring to FIG. 35, the isolation sacrificial layer 120 (referring to FIG. 34) on the top surface of the metal bump 102 may be removed by an etching process to expose the top surface of the metal bump 102.

In one embodiment, an opening 121 in the first encapsulation layer 103 may be formed at a corresponding position for removing the isolation sacrificial layer 120, and the opening 121 may expose the top surface of the metal bump 102. In the present disclosure, by forming the isolation sacrificial layer 120, the portion of the first encapsulation material layer may be removed by a chemical mechanical polishing process to expose the surface of the isolation sacrificial layer. The isolation sacrificial layer on the top surface of the metal bump 102 may be removed by an etching process to expose the top surface of the metal bump 102.

Therefore, through the combination of the aforementioned specific structure and specific process, not only the top surface of the metal bump may be exposed, but also when removing the portion of the first encapsulation material layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position between the subsequently formed rewiring layer and the corresponding metal bump, and may further improve the electrical connection performance between the rewiring layer and the metal bump 102.

The etching process for removing the isolation sacrificial layer 120 may include a wet etching process or a dry etching process. In one embodiment, when the isolation sacrificial layer 120 is made of silicon nitride, the isolation sacrificial layer 120 may be removed by a wet etching process, and an etching solution used in the wet etching process may include a phosphoric acid solution.

Figure 36:
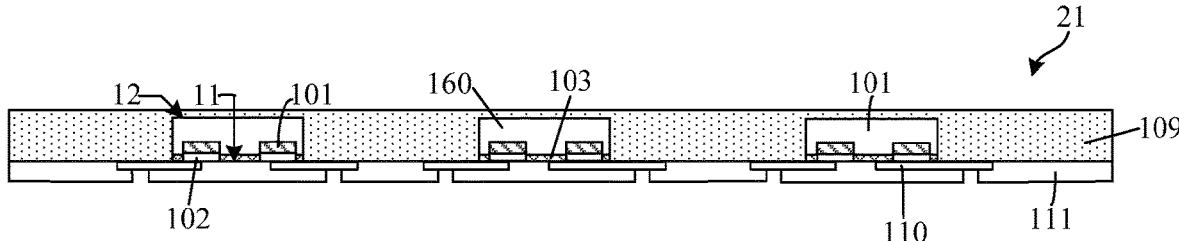
Figure 37:
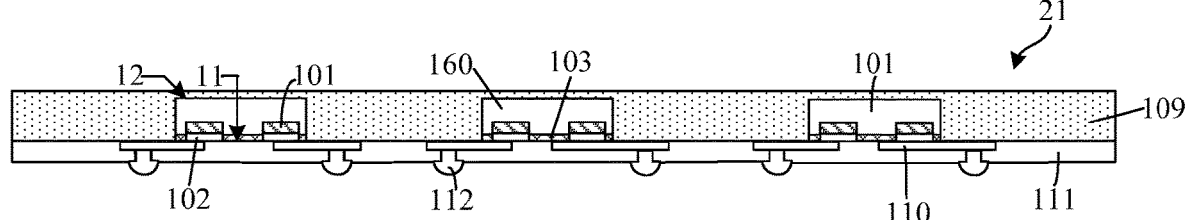

Referring to FIG. 36 and FIG. 37, an external contact structure connected to the metal bump 102 may be formed on the back side of the pre-encapsulation panel 21. The external contact structure may include a rewiring layer 110 located on the back side of the pre-encapsulation panel 21 and connected to the metal bump 102, and an external contact element 112 located on the rewiring layer 110 and connected to the rewiring layer 110. The metal bump 102 on each semiconductor chip 160 may be connected to a corresponding external contact structure. In one embodiment, the external contact element 112 may be a solder ball. In another embodiment, the external contact element 112 may include a metal pillar and a solder ball located on the surface of the metal pillar.

In one embodiment, the process of forming the rewiring layer 110 and the external contact element 112 may include following. After peeling off the carrier board, the rewiring layer 110 may be formed on the back side of the pre-encapsulation panel 21. An insulating layer 111 may be formed on the rewiring layer 110 and the back side of the pre-encapsulation panel 21. The insulating layer 111 may have an opening that exposes a partial surface of the rewiring layer 110. The material of the insulating layer 111 may include silicon nitride, borosilicate glass, phosphorous silicate glass, or borophosphosilicate glass. The external contact element 112 may be formed in the opening.

Figure 38:
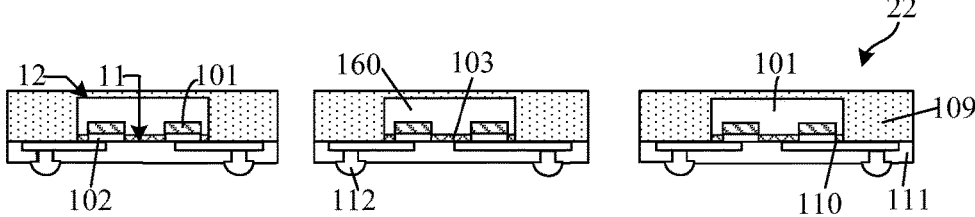

Referring to FIG. 38, after forming the external contact structure, the pre-encapsulation panel may be cut to form a plurality of discrete packaging structures 22.

It should be noted that the process of forming the external contact structure on the basis of FIG. 35 may be substantially the same as the process of forming the external contact structure in FIGS. 36-37, and details may not be repeated herein.

Exemplary Embodiment 4

The present disclosure also provides a packaging structure. Referring to FIG. 31 or FIG. 32, the packaging structure may include a carrier board 107 and a plurality of semiconductor chips 160 adhered to the carrier board 107. Each semiconductor chip 160 may have a functional surface 11 and a non-functional surface 12 opposite to the functional surface 11. A plurality of pads 101 may be formed on the functional surface 11. A metal bump 102 may be formed on the surface of a pad 101 of the plurality of pads 101. A first encapsulation layer 103 may be formed over the functional surface 11. A top surface of the first encapsulation layer 103 may be coplanar with a top surface of the metal bump. The first encapsulation layer 103 and the pad 101 on the functional surface of the semiconductor chip 160 may be adhered to the carrier board 107.

The packaging structure may also include a second encapsulation layer 109 formed on the carrier board 107 and covering the non-functional surface and the sidewall surface of the semiconductor chip 160.

In one embodiment, the semiconductor chip 160 may be formed by an integrated manufacturing process. A wafer may be provided, and the plurality of semiconductor chips may be formed on the wafer. Each semiconductor chip may include the functional surface, and the plurality of pads may be formed on the functional surface. The metal bump may be formed on the pad. The first encapsulation material layer may be formed to cover the metal bump and the functional surface. The first encapsulation material layer may be planarized to expose the surface of the metal bump. The remaining first encapsulation material layer may form the first encapsulation layer. A surface of the first encapsulation layer may be coplanar with a surface of the metal bump. After forming the first encapsulation layer, the wafer may be cut to form the plurality of discrete semiconductor chips.

In one embodiment, the material of the first encapsulation material layer and the second encapsulation layer 109 may include resin. The process of forming the first encapsulation material layer and the second encapsulation layer 109 may include an injection molding process or a transfer molding process.

In one embodiment, the size of the material particle in the first encapsulation layer 103 may be smaller than the size of the material particle in the second encapsulation layer 109.

In one embodiment, referring to FIG. 32, the metal bump 102 may also include the isolation sacrificial layer 120 formed on the top surface or the top and sidewall surfaces of the metal bump 102. The surface of the first encapsulation layer 103 may be coplanar with the top surface of the isolation sacrificial layer 120. The material of the isolation sacrificial layer 120 may include silicon oxide, silicon nitride, or silicon oxynitride.

In one embodiment, the semiconductor chip 160 may be formed by an integrated manufacturing process. A wafer may be provided, and the plurality of semiconductor chips may be formed on the wafer. Each semiconductor chip may include the functional surface, and the plurality of pads may be formed on the functional surface. The metal bump may be formed on the pad, and an isolation sacrificial layer may be formed on the metal bump. The first encapsulation material layer may be formed to cover the isolation sacrificial layer and the functional surface. The first encapsulation material layer may be planarized to expose the surface of the isolation sacrificial layer. The remaining first encapsulation material layer may form the first encapsulation layer. A surface of the first encapsulation layer may be coplanar with a surface of the isolation sacrificial layer. After forming the first encapsulation layer, the wafer may be cut to form the plurality of discrete semiconductor chips.

It should be noted that the same or similar structures of the packaging structure may not be repeated herein, and details may refer to the definitions or descriptions of corresponding parts in the method of forming the packaging structure.

Exemplary Embodiment 5

FIGS. 39-56 illustrate schematic diagrams of semiconductor structures corresponding to certain stages of a method for forming a packaging structure consistent with various disclosed embodiments of the present disclosure. Referring to FIGS. 39-44, a plurality of semiconductor chips 160 (referring to FIG. 44) may be provided. Each semiconductor chip 160 may have a functional surface 11 and a non-functional surface 12 opposite to the functional surface 11. A plurality of pads 101 may be formed on the functional surface 11. A metal bump 102 may be formed on a surface of a pad 101 of the plurality of pads 101. A first encapsulation layer 103 may be formed over the functional surface 11, and the first encapsulation layer 103 may cover the metal bump 102.

The semiconductor chip 160 may have the functional surface 11 and the non-functional surface 12 opposite to the functional surface 11. The functional surface of the semiconductor chip may be a surface where an integrated circuit and the plurality of pads are formed. The integrated circuit may be formed in the semiconductor chip 160. The plurality of pads 101 may be formed on the functional surface of the semiconductor chip 160. The pad 101 may be electrically connected to the integrated circuit in the semiconductor chip 160. The pad 101 may serve as a port for the integrated circuit in the semiconductor chip 160 to be electrically connected to an external circuit.

In one embodiment, the integrated circuit in the semiconductor chip 160 may include a plurality of semiconductor devices (e.g., transistor, memory, sensor, diode and/or triode, etc.) and an interconnection structure (including metal wire and metal plug) for connecting the semiconductor devices. The surrounding surface between the functional surface 11 and the non-functional surface 12 of the semiconductor chip 160 may be the sidewall of the semiconductor chip 160.

The semiconductor chip 160 may be formed by a semiconductor integrated manufacturing process. The detailed process of forming the semiconductor chip 160 may be described in detail below with reference to FIGS. 39-44.

Figure 39:
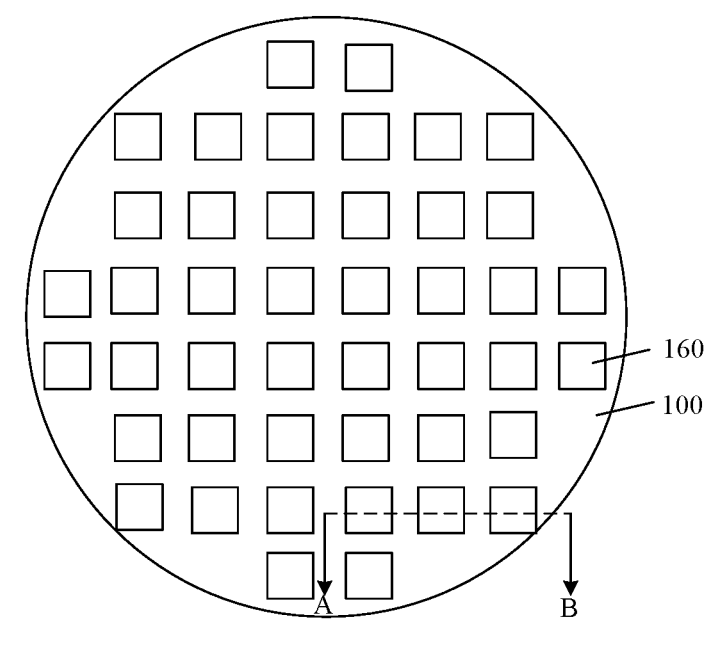
Figure 40:
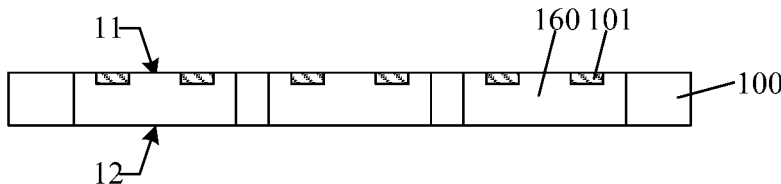

FIG. 40 illustrates a schematic AB sectional view of a semiconductor structure in FIG. 39. Referring to FIG. 39 and FIG. 40, a wafer 100 may be provided. The wafer 100 may include a plurality of chip regions arranged in rows and columns and a scribe-line region between the chip regions. The plurality of chip regions of the wafer 100 may be used for correspondingly forming the plurality of semiconductor chips 160. The plurality of pads 101 may be formed on the functional surface of the semiconductor chip 160.

In one embodiment, the wafer 100 may be monocrystalline silicon (Si), monocrystalline germanium (Ge), silicon germanium (GeSi), or silicon carbide (SiC). In another embodiment, the wafer may be silicon on insulator (SOI), or germanium on insulator (GOI). In certain embodiments, the wafer may be any other suitable material, e.g., Group III-V compounds, such as *allium* arsenide (GaAs), etc. The pad may be made of one of aluminum, nickel, tin, tungsten, platinum, copper, and titanium.

Figure 41:
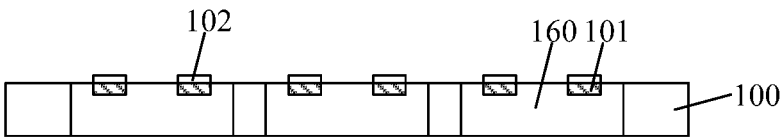
Figure 42:
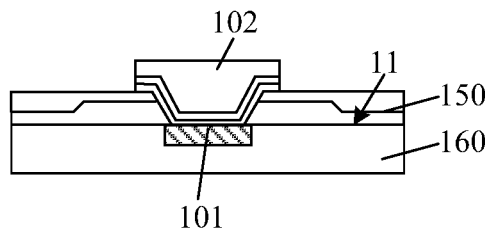

FIG. 42 illustrates an enlarged schematic diagram of a metal bump formed on the pad in FIG. 41. Referring to FIG. 41 and FIG. 42, a metal bump 102 may be formed on the surface of the pad 101.

The metal bump 102 may protrude from the surface of the pad 101 and the functional surface. In one embodiment, the material of the metal bump 102 may include one or more of aluminum, nickel, tin, tungsten, platinum, copper, titanium, chromium, tantalum, gold and silver. The metal bump 102 may raise the pad 101 to facilitate subsequent wiring, may protect the pad, and may provide a thermal dissipation path.

In one embodiment, the process of forming the metal bump 102 may include following. An insulating layer 150 may be formed on the functional surface 11 of the semiconductor chip 160. The insulating layer 150 may have a first opening exposing a portion of the surface of the pad 101. The insulating layer 150 may have a single-layer or multi-layer stacked structure. The material of the insulating layer 150 may include one or more of silicon nitride, silicon oxide, and resin. An under-bump metal (UBM) layer may be formed on the surface of the insulating layer 150 and on the sidewall and bottom surfaces of the first opening. The UBM layer may have a single-layer or multi-layer stacked structure. A mask layer having a second opening may be formed on the UBM layer. The second opening may at least expose the surface of the UBM layer in the first opening. The metal bump 102 may be formed in the second opening by an electroplating process. The mask layer may be removed, and the UBM layer on the surface of the insulating layer on both sides of the metal bump 102 may be removed by etching.

Figure 43:
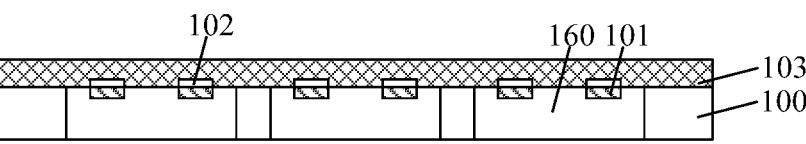

Referring to FIG. 43, a first encapsulation layer 103 may be formed on the surface of the wafer 100 (the functional surface of the semiconductor chip 160). The first encapsulation layer 103 may cover the metal bump 102.

The first encapsulation layer 103 may cover the top and sidewall surfaces of the metal bump 102. The first encapsulation layer 103 may have a flat surface, and the process of forming the first encapsulation layer 103 may include an injection molding process or a transfer molding process. The first encapsulation layer 103 may be made of resin. The resin may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol.

In one embodiment, when performing the injection molding process or transfer molding process, the bottom of the wafer 100 may be fixed in the mold. Due to the large area of the bottom of the wafer, when forming the first encapsulation layer, there may be no step between the semiconductor chips 160. Therefore, holes or gap defects may not be formed between the first encapsulation layer 103 and the metal bump, and the first encapsulation layer 103 may well cover the metal bump 102. The first encapsulation layer 103 at a different position on the functional surface of the semiconductor chip 160 may have uniform density and hardness.

Therefore, after subsequently forming a second encapsulation layer on the carrier board to cover the plurality of semiconductor chips 160, when planarizing the second encapsulation layer and the first encapsulation layer by a chemical mechanical polishing process, the first encapsulation layer 103 may well prevent the metal bump 102 from detaching or being shifted from the surface of the pad 101 during the polishing process. Further, the first encapsulation layer 103 may prevent the metal bump 102 from being over-polished. When subsequently forming a rewiring layer on the planarized first encapsulation layer 103 and the second encapsulation layer, the connection position of the rewiring layer and the metal bump 102 may not be shifted, thereby improving the electrical connection performance between the rewiring layer and the pad in the packaging structure.

In addition, the formed first encapsulation layer 103 may also be used to protect the metal bump 102, and may prevent the metal bump 102 from being contaminated or damaged in subsequent processes.

In one embodiment, the size of the material particle in the first encapsulation layer 103 may be smaller than the size of the material particle in the subsequently formed second encapsulation layer, such that the first encapsulation layer 103 may substantially well fill gaps between the metal bumps 102 and on both sides of the metal bump 102. The contact between the first encapsulation layer 103 and the side of the metal bump 102 may be substantially tight, and the first encapsulation layer 103 may have a desired fixing effect for the metal bump 102. When subsequently planarizing the first encapsulation layer and the second encapsulation layer by a chemical mechanical polishing process to expose the top surface of the metal bump 102, the metal bump 102 may be prevented from being loosened or coming off from the pad 101, and may be prevented from being over-polished.

Figures 44, 45, 46, 47, 48, 49:
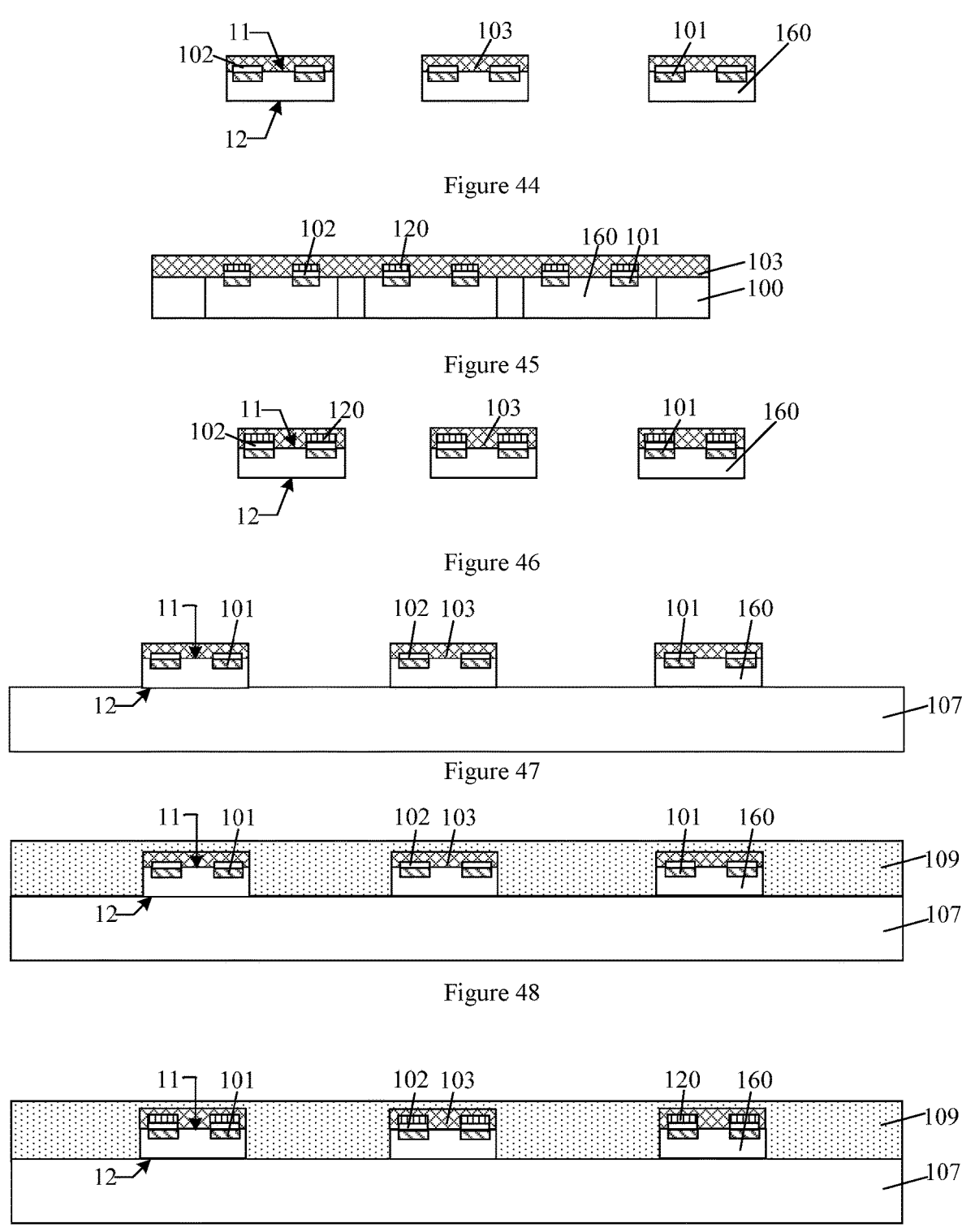

Referring to FIG. 44, the wafer 100 (referring to FIG. 43) may be cut along the scribe-line region to form a plurality of discrete semiconductor chips 160 having the first encapsulation layer 103.

In certain embodiments, referring to FIG. 45, after forming the metal bump 102 and before forming the first encapsulation layer 103, an isolation sacrificial layer 120 may be formed on the top surface or on the top and sidewall surfaces of the metal bump 102. After forming the isolation sacrificial layer 120, the first encapsulation layer 103 may be formed to cover the isolation sacrificial layer 120 and the semiconductor chip 160.

If the formed first encapsulation layer 103 directly covers the surface of the metal bump 102, after subsequently forming the second encapsulation layer covering the first encapsulation layer on the functional surface and the sidewall surface of the semiconductor chip, a portion of the first encapsulation layer and the second encapsulation layer may need to be removed by a planarization process (chemical mechanical polishing process) to expose the top surface of the metal bump 102. During the planarization process (chemical mechanical polishing process), the polishing force may be likely to cause certain metal bump 102 to be loosened or come off from the pad 101.

Therefore, in the present disclosure, before forming the first encapsulation layer 103, the isolation sacrificial layer 120 may be formed on the top surface or the top and sidewall surfaces of the metal bump 102. A portion of the first encapsulation layer 103 and the second encapsulation layer may be removed by combined chemical mechanical polishing process and etching process to expose the metal bump. In one embodiment, the chemical mechanical polishing process may be first used to remove a portion of the first encapsulation layer and the second encapsulation layer to expose the surface of the isolation sacrificial layer, and then the isolation sacrificial layer on the top surface of the metal bump 102 may be removed by an etching process to expose the top surface of the metal bump.

Through the aforementioned specific structure and specific process, not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position of the subsequently formed rewiring layer and the corresponding metal bump, and may further improve the electrical connection performance between the rewiring layer and the metal bump 102.

In addition, the formed isolation sacrificial layer 120 may also improve the adhesive force between the first encapsulation layer 103 and the metal bump 102. In one embodiment, the material of the isolation sacrificial layer 120 may include silicon oxide, silicon nitride, or silicon oxynitride.

Referring to FIG. 46, the wafer 100 (referring to FIG. 45) may be cut along the scribe-line region to form a plurality of discrete semiconductor chips 160 having the isolation sacrificial layer 120 and the first encapsulation layer 103.

Referring to FIG. 47 or FIG. 49, a carrier board 107 may be provided. The non-functional surface of each semiconductor chip 160 may be adhered to the carrier board 107. The carrier board 107 may provide a supporting platform for subsequent processes. In one embodiment, the carrier board 107 may be a glass carrier board, a silicon carrier board, or a metal carrier board. In another embodiment, the carrier board may be a carrier board made of any other suitable material.

The non-functional surface of the semiconductor chip 160 may be adhered to the surface of the carrier board 107 by an adhesive layer. The non-functional surface of the semiconductor chip 160 may face toward an adhesive surface of the carrier board 107. The plurality of semiconductor chips 160 may be uniformly adhered to the carrier board 107 in rows and columns.

The adhesive layer may be made of various materials. In one embodiment, the adhesive layer may be made of an UV glue. The UV glue may be a kind of glue material that can be reacted under irradiation of ultraviolet light of special wavelength. The UV glue may be divided into two types according to the change in viscosity after irradiation of ultraviolet light. One kind of the UV glue may be an UV curing glue, that is, the photoinitiator or photosensitizer in the material may absorb ultraviolet light under radiation of ultraviolet light to produce active radicals or cations, which may initiate monomer polymerization, cross-linking and graft chemical reactions to enable the UV curing glue to change from liquid to solid within a few seconds, thereby bonding the surfaces of objects being in contact. Another kind of the UV glue may have substantially high viscosity when not exposed to UV light, and after being exposed to ultraviolet light, the cross-linking chemical bonds in the UV glue may be broken, which may cause the viscosity to significantly decrease or even disappear. The UV glue used for the adhesive layer here may be the latter one. The adhesive layer may be formed by a film-sticking process, a glue-printing process, or a glue-rolling process.

In certain embodiments, the adhesive layer may be made of epoxy glue, polyimide glue, polyethylene glue, benzocyclobutene glue, or polybenzoxazole glue.

Referring to FIG. 48 or FIG. 49, a second encapsulation layer 109 may be formed on the carrier board 107 to cover the first encapsulation layer 103 on the functional surface and the sidewall surface of the semiconductor chip 160.

The second encapsulation layer 109 may be used to seal and fix the semiconductor chip 160. The second encapsulation layer 109 may also cover the surface of the carrier board 107.

The material of the second encapsulation layer 109 may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol. The second encapsulation layer 109 may be formed by an injection molding process, a transfer molding process, or any other suitable process.

Figures 50, 51, 52, 53, 54, 55:
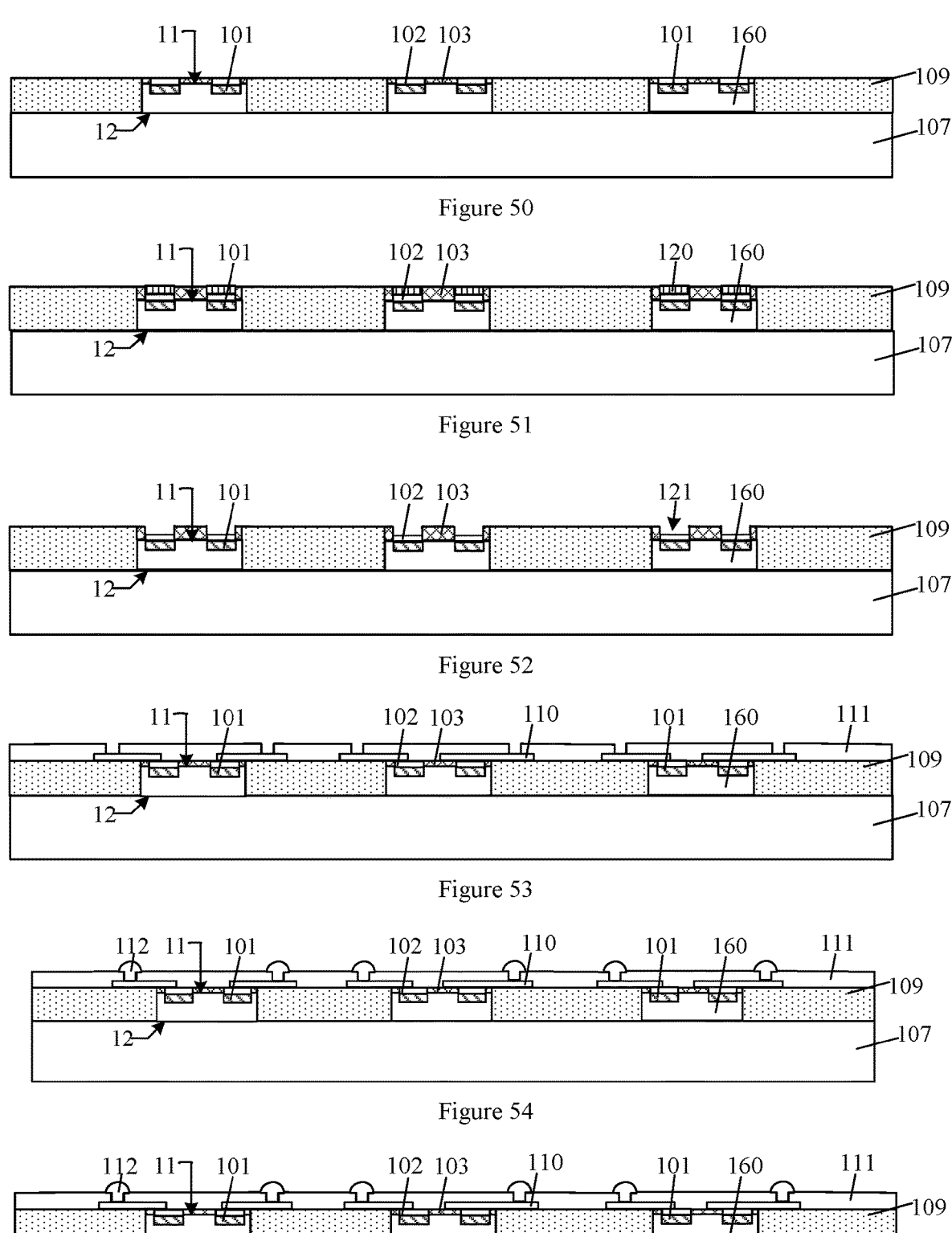

Referring to FIG. 50 (on the basis of FIG. 48) or in combination with FIG. 51 (on the basis of FIG. 49) and FIG. 52 (on the basis of FIG. 51), a portion of the first encapsulation layer 103 and the second encapsulation layer 109 on the carrier board 107 may be removed by a planarization process, to expose the top surface of the metal bump 102.

In one embodiment, when the isolation sacrificial layer is not formed, the portion of the first encapsulation layer 103 and the second encapsulation layer 109 on the carrier board 107 may be directly removed by a chemical mechanical polishing process to expose the metal bump 102.

When directly removing the portion of the first encapsulation layer 103 and the second encapsulation layer 109 on the carrier board 107 by a chemical mechanical polishing process, because the formed first encapsulation layer 103 well covers the metal bump 102, and the first encapsulation layer 103 at a different position on the functional surface of the semiconductor chip 160 has uniform density and hardness, the first encapsulation layer 103 may well prevent the metal bump 102 from detaching or being shifted from the surface of the pad 101 during the polishing process. Further, the first encapsulation layer 103 may prevent the metal bump 102 from being over-polished. When subsequently forming a rewiring layer on the planarized first encapsulation layer 103 and the second encapsulation layer 109, the connection position of the rewiring layer and the metal bump 102 may not be shifted, thereby improving the electrical connection performance between the rewiring layer and the pad in the packaging structure.

In another embodiment, when the isolation sacrificial layer 120 is formed, referring to FIG. 51, the portion of the first encapsulation layer 103 and the second encapsulation layer 109 may be first removed by a chemical mechanical polishing process to expose the surface of the isolation sacrificial layer 120. Referring to FIG. 52, the isolation sacrificial layer 120 (referring to FIG. 51) on the top surface of the metal bump 102 may be removed by an etching process to expose the top surface of the metal bump 102.

In one embodiment, an opening 121 may be formed at a corresponding position for removing the isolation sacrificial layer 120, and the opening 121 may expose the top surface of the metal bump 102. In the present disclosure, by forming the isolation sacrificial layer 120, the portion of the first encapsulation layer and the second encapsulation layer may be removed by a chemical mechanical polishing process to expose the surface of the isolation sacrificial layer. The isolation sacrificial layer on the top surface of the metal bump 102 may be removed by an etching process to expose the top surface of the metal bump 102.

Therefore, through the combination of the aforementioned specific structure and specific process, not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position between the subsequently formed rewiring layer and the corresponding metal bump, and may further improve the electrical connection performance between the rewiring layer and the metal bump 102.

The etching process for removing the isolation sacrificial layer 120 may include a wet etching process or a dry etching process. In one embodiment, when the isolation sacrificial layer 120 is made of silicon nitride, the isolation sacrificial layer 120 may be removed by a wet etching process, and an etching solution used in the wet etching process may include a phosphoric acid solution.

Referring to FIG. 53 (on the basis of FIG. 50) and FIG. 54, an external contact structure connected to the metal bump 102 may be formed on the surface of the planarized first encapsulation layer 103 and the second encapsulation layer 109. The external contact structure may include a rewiring layer 110 located on the surface of the planarized first encapsulation layer 103 and the second encapsulation layer 109 and connected to the metal bump 102, and an external contact element 112 located on the rewiring layer 110 and connected to the rewiring layer 110. The metal bump 102 on each semiconductor chip 160 may be connected to a corresponding external contact structure. In one embodiment, the external contact element 112 may be a solder ball. In another embodiment, the external contact element 112 may include a metal pillar and a solder ball located on the surface of the metal pillar.

In one embodiment, the process of forming the rewiring layer 110 and the external contact element 112 may include following. The rewiring layer 110 may be formed on the surface of the planarized first encapsulation layer 103 and the second encapsulation layer 109. An insulating layer 111 may be formed on the rewiring layer 110 and the surface of the planarized first encapsulation layer 103 and the second encapsulation layer 109. The insulating layer 111 may have an opening that exposes a partial surface of the rewiring layer 110. The material of the insulating layer 111 may include silicon nitride, borosilicate glass, phosphorous silicate glass, or borophosphosilicate glass. The external contact element 112 may be formed in the opening.

It should be noted that the process of forming the external contact structure on the basis of FIG. 52 may be substantially the same as the process of forming the external contact structure in FIGS. 53-54, and details may not be repeated herein.

Referring to FIG. 55, after forming the external contact structure, the carrier board (referring to FIG. 54) may be peeled off. The adhesive layer may be removed by chemical etching, mechanical peeling, chemical mechanical polishing (CMP), mechanical grinding, thermal baking, etc., such that the carrier board 107 may be peeled off.

Referring to FIG. 56, after peeling off the carrier board, a plurality of discrete packaging structures 22 may be formed by performing a cutting process.

Exemplary Embodiment 6

The present disclosure also provides a packaging structure. Referring to FIG. 48 or FIG. 49, the packaging structure may include a carrier board 107 and a plurality of semiconductor chips 160 adhered to the carrier board 107. Each semiconductor chip 160 may have a functional surface 11 and a non-functional surface 12 opposite to the functional surface 11. A plurality of pads 101 may be formed on the functional surface 11. A metal bump 102 may be formed on the surface of a pad 101 of the plurality of pads 101. A first encapsulation layer 103 may be formed over the functional surface 11. The first encapsulation layer 103 may cover the metal bump 102. The non-functional surface of the semiconductor chip 160 may be adhered to the carrier board 107.

The packaging structure may also include a second encapsulation layer 109 formed on the carrier board 107 and covering the first encapsulation layer on the functional surface and the sidewall surface of the semiconductor chip 160.

In one embodiment, the semiconductor chip 160 may be formed by an integrated manufacturing process. A wafer may be provided, and the plurality of semiconductor chips may be formed on the wafer. Each semiconductor chip may include the functional surface, and the plurality of pads may be formed on the functional surface. The metal bump may be formed on the pad. The first encapsulation layer may be formed to cover the metal bump and the functional surface. After forming the first encapsulation layer, the wafer may be cut to form the plurality of discrete semiconductor chips.

In one embodiment, the material of the first encapsulation layer 103 and the second encapsulation layer 109 may include resin. The process of forming the first encapsulation layer and the second encapsulation layer may include an injection molding process or a transfer molding process.

In one embodiment, the size of the material particle in the first encapsulation layer 103 may be smaller than the size of the material particle in the second encapsulation layer 109.

In one embodiment, referring to FIG. 49, the packaging structure may also include an isolation sacrificial layer 120 formed on the top surface or the top and sidewall surfaces of the metal bump 102. The first encapsulation layer 103 may further cover the isolation sacrificial layer 120. The material of the isolation sacrificial layer 120 may include silicon oxide, silicon nitride, or silicon oxynitride.

It should be noted that the same or similar structures of the packaging structure may not be repeated herein, and details may refer to the definitions or descriptions of corresponding parts in the method of forming the packaging structure.

Exemplary Embodiment 7

FIGS. 57-74 illustrate schematic diagrams of semiconductor structures corresponding to certain stages of a method for forming a packaging structure consistent with various disclosed embodiments of the present disclosure. Referring to FIGS. 57-62, a plurality of semiconductor chips 160 (referring to FIG. 62) may be provided. Each semiconductor chip 160 may have a functional surface 11 and a non-functional surface 12 opposite to the functional surface 11. A plurality of pads 101 may be formed on the functional surface 11. A metal bump 102 may be formed on a surface of a pad 101 of the plurality of pads 101. A first encapsulation layer 103 may be formed over the functional surface 11, and the first encapsulation layer 103 may cover the metal bump 102.

The semiconductor chip 160 may have the functional surface 11 and the non-functional surface 12 opposite to the functional surface 11. The functional surface of the semiconductor chip may be a surface where an integrated circuit and the plurality of pads are formed. The integrated circuit may be formed in the semiconductor chip 160. The plurality of pads 101 may be formed on the functional surface of the semiconductor chip 160. The pad 101 may be electrically connected to the integrated circuit in the semiconductor chip 160. The pad 101 may serve as a port for the integrated circuit in the semiconductor chip 160 to be electrically connected to an external circuit.

In one embodiment, the integrated circuit in the semiconductor chip 160 may include a plurality of semiconductor devices (e.g., transistor, memory, sensor, diode and/or triode, etc.) and an interconnection structure (including metal wire and metal plug) for connecting the semiconductor devices. The surrounding surface between the functional surface 11 and the non-functional surface 12 of the semiconductor chip 160 may be the sidewall of the semiconductor chip 160.

The semiconductor chip 160 may be formed by a semiconductor integrated manufacturing process. The detailed process of forming the semiconductor chip 160 may be described in detail below with reference to FIGS. 57-62. FIG. 58 illustrates a schematic AB sectional view of a semiconductor structure in FIG. 57. Referring to FIG. 57 and FIG. 58, a wafer 100 may be provided. The wafer 100 may include a plurality of chip regions arranged in rows and columns and a scribe-line region between the chip regions. The plurality of chip regions of the wafer 100 may be used for correspondingly forming the plurality of semiconductor chips 160. The plurality of pads 101 may be formed on the functional surface of the semiconductor chip 160.

In one embodiment, the wafer 100 may be monocrystalline silicon (Si), monocrystalline germanium (Ge), silicon germanium (GeSi), or silicon carbide (SiC). In another embodiment, the wafer may be silicon on insulator (SOI), or germanium on insulator (GOI). In certain embodiments, the wafer may be any other suitable material, e.g., Group III-V compounds, such as *allium* arsenide (GaAs), etc. The pad may be made of one of aluminum, nickel, tin, tungsten, platinum, copper, and titanium.

FIG. 60 illustrates an enlarged schematic diagram of a metal bump formed on the pad in FIG. 59. Referring to FIG. 59 and FIG. 60, a metal bump 102 may be formed on the surface of the pad 101.

The metal bump 102 may protrude from the surface of the pad 101 and the functional surface. In one embodiment, the material of the metal bump 102 may include one or more of aluminum, nickel, tin, tungsten, platinum, copper, titanium, chromium, tantalum, gold and silver. The metal bump 102 may raise the pad 101 to facilitate subsequent wiring, may protect the pad, and may provide a thermal dissipation path. In one embodiment, the process of forming the metal bump 102 may include following. An insulating layer 150 may be formed on the functional surface 11 of the semiconductor chip 160. The insulating layer 150 may have a first opening exposing a portion of the surface of the pad 101. The insulating layer 150 may have a single-layer or multi-layer stacked structure. The material of the insulating layer 150 may include one or more of silicon nitride, silicon oxide, and resin. An under-bump metal (UBM) layer may be formed on the surface of the insulating layer 150 and on the sidewall and bottom surfaces of the first opening. The UBM layer may have a single-layer or multi-layer stacked structure. A mask layer having a second opening may be formed on the UBM layer. The second opening may at least expose the surface of the UBM layer in the first opening. The metal bump 102 may be formed in the second opening by an electroplating process. The mask layer may be removed, and the UBM layer on the surface of the insulating layer on both sides of the metal bump 102 may be removed by etching.

Figures 61, 62, 63, 64, 65, 66:
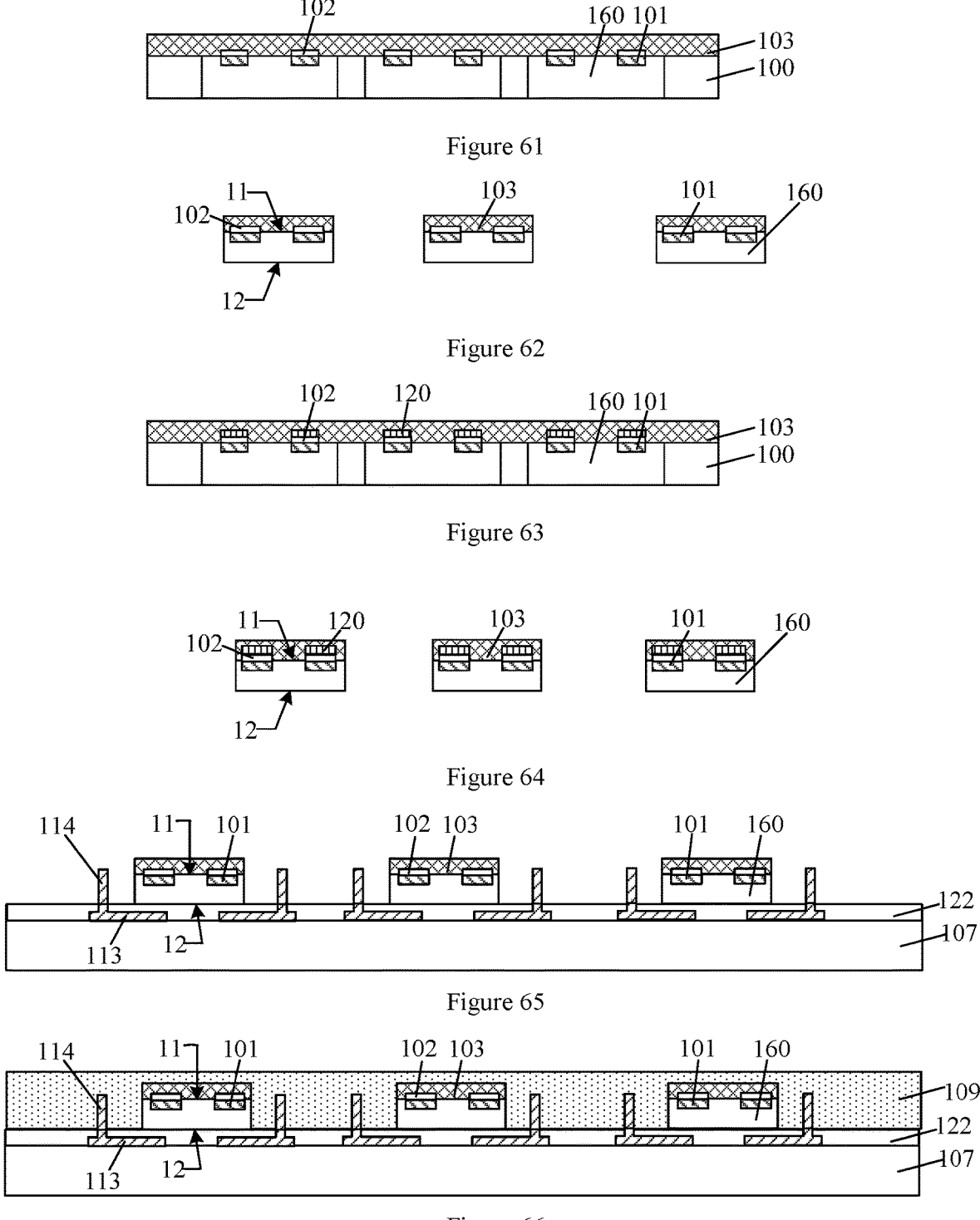

Referring to FIG. 61, a first encapsulation layer 103 may be formed on the surface of the wafer 100 (the functional surface of the semiconductor chip 160). The first encapsulation layer 103 may cover the metal bump 102.

The first encapsulation layer 103 may cover the top and sidewall surfaces of the metal bump 102. The first encapsulation layer 103 may have a flat surface, and the process of forming the first encapsulation layer 103 may include an injection molding process or a transfer molding process. The first encapsulation layer 103 may be made of resin. The resin may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol.

In one embodiment, when performing the injection molding process or transfer molding process, the bottom of the wafer 100 may be fixed in the mold. Due to the large area of the bottom of the wafer, when forming the first encapsulation layer, there may be no step between the semiconductor chips 160. Therefore, holes or gap defects may not be formed between the first encapsulation layer 103 and the metal bump, and the first encapsulation layer 103 may well cover the metal bump 102. The first encapsulation layer 103 at a different position on the functional surface of the semiconductor chip 160 may have uniform density and hardness.

Therefore, after subsequently forming a second encapsulation layer on the carrier board to cover the plurality of semiconductor chips 160, when planarizing the second encapsulation layer and the first encapsulation layer by a chemical mechanical polishing process, the first encapsulation layer 103 may well prevent the metal bump 102 from detaching or being shifted from the surface of the pad 101 during the polishing process. Further, the first encapsulation layer 103 may prevent the metal bump 102 from being over-polished. When subsequently forming a rewiring layer on the planarized first encapsulation layer 103 and the second encapsulation layer, the connection position of the rewiring layer and the metal bump 102 may not be shifted, thereby improving the electrical connection performance between the rewiring layer and the pad in the packaging structure.

In addition, the formed first encapsulation layer 103 may also be used to protect the metal bump 102, and may prevent the metal bump 102 from being contaminated or damaged in subsequent processes.

In one embodiment, the size of the material particle in the first encapsulation layer 103 may be smaller than the size of the material particle in the subsequently formed second encapsulation layer, such that the first encapsulation layer 103 may substantially well fill gaps between the metal bumps 102 and on both sides of the metal bump 102. The contact between the first encapsulation layer 103 and the side of the metal bump 102 may be substantially tight, and the first encapsulation layer 103 may have a desired fixing effect for the metal bump 102. When subsequently planarizing the first encapsulation layer and the second encapsulation layer by a chemical mechanical polishing process to expose the top surface of the metal bump 102, the metal bump 102 may be prevented from being loosened or coming off from the pad 101, and may be prevented from being over-polished.

Referring to FIG. 62, the wafer 100 (referring to FIG. 61) may be cut along the scribe-line region to form a plurality of discrete semiconductor chips 160 having the first encapsulation layer 103.

In certain embodiments, referring to FIG. 63, after forming the metal bump 102 and before forming the first encapsulation layer 103, an isolation sacrificial layer 120 may be formed on the top surface or on the top and sidewall surfaces of the metal bump 102. After forming the isolation sacrificial layer 120, the first encapsulation layer 103 may be formed to cover the isolation sacrificial layer 120 and the semiconductor chip 160.

If the formed first encapsulation layer 103 directly covers the surface of the metal bump 102, after subsequently forming the second encapsulation layer covering the first encapsulation layer on the functional surface and the sidewall surface of the semiconductor chip, a portion of the first encapsulation layer and the second encapsulation layer may need to be removed by a planarization process (chemical mechanical polishing process) to expose the top surface of the metal bump 102. During the planarization process (chemical mechanical polishing process), the polishing force may be likely to cause certain metal bump 102 to be loosened or come off from the pad 101.

Therefore, in the present disclosure, before forming the first encapsulation layer 103, the isolation sacrificial layer 120 may be formed on the top surface or the top and sidewall surfaces of the metal bump 102. A portion of the first encapsulation layer 103 and the second encapsulation layer may be removed by combined chemical mechanical polishing process and etching process to expose the metal bump. In one embodiment, the chemical mechanical polishing process may be first used to remove a portion of the first encapsulation layer and the second encapsulation layer to expose the surface of the isolation sacrificial layer, and then the isolation sacrificial layer on the top surface of the metal bump 102 may be removed by an etching process to expose the top surface of the metal bump.

Through the aforementioned specific structure and specific process, not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position of the subsequently formed rewiring layer and the corresponding metal bump, and may further improve the electrical connection performance between the rewiring layer and the metal bump 102.

In addition, the formed isolation sacrificial layer 120 may also improve the adhesive force between the first encapsulation layer 103 and the metal bump 102. In one embodiment, the material of the isolation sacrificial layer 120 may include silicon oxide, silicon nitride, or silicon oxynitride.

Referring to FIG. 64, the wafer 100 (referring to FIG. 63) may be cut along the scribe-line region to form a plurality of discrete semiconductor chips 160 having the isolation sacrificial layer 120 and the first encapsulation layer 103.

Figures 67, 68, 69, 70, 71, 72:
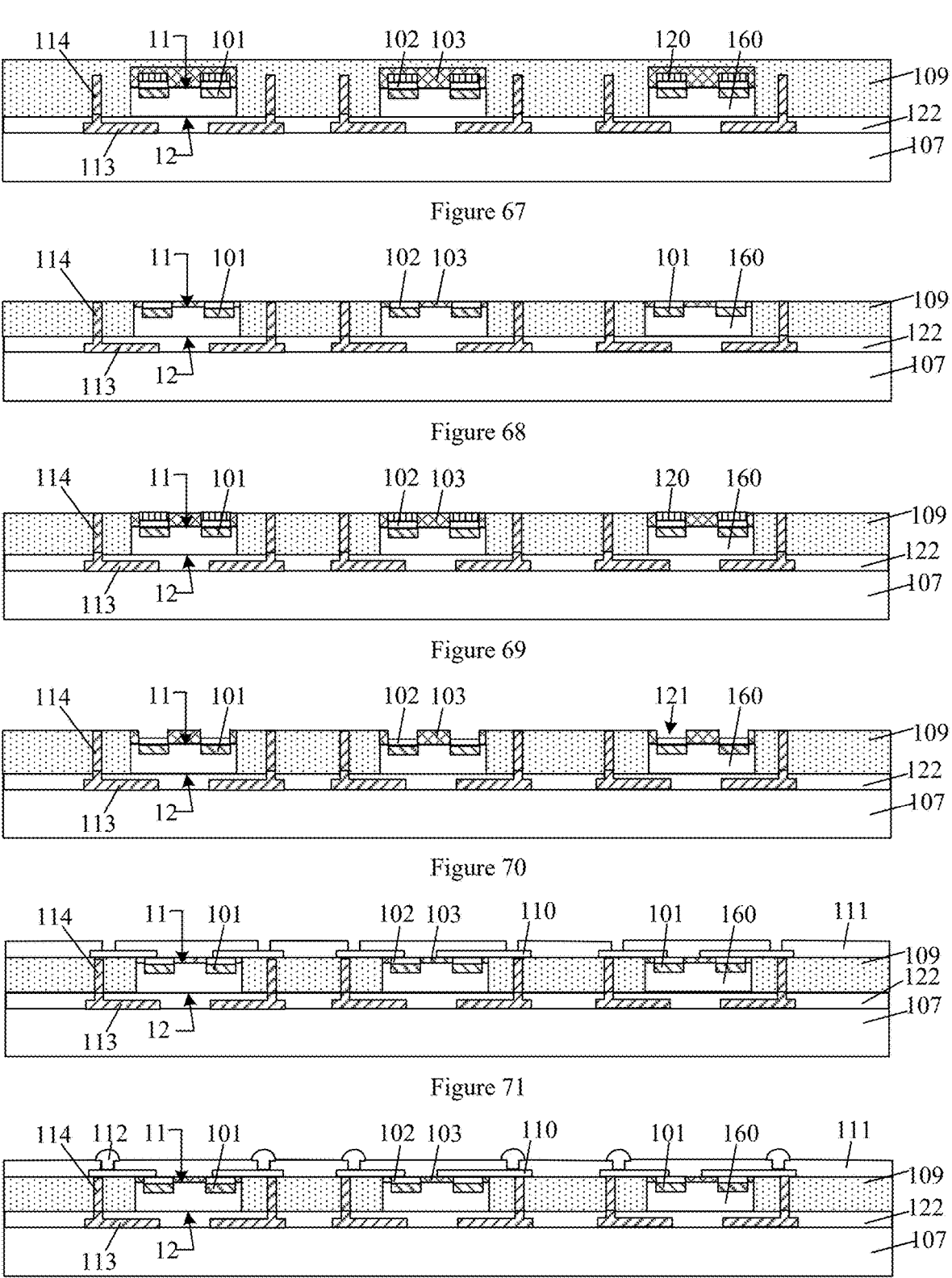

Referring to FIG. 65 or FIG. 67, a carrier board 107 may be provided. A plurality of wiring layers 113 may be formed on the surface of the carrier board 107, and a connection element 114 may be formed on the wiring layer 113. The non-functional surface of each semiconductor chip 160 may be adhered to the surface of the carrier board 107 on which the connection element 114 is formed. The carrier board 107 may provide a supporting platform for subsequent processes. In one embodiment, the carrier board 107 may be a glass carrier board, a silicon carrier board, or a metal carrier board. In another embodiment, the carrier board may be a carrier board made of any other suitable material.

The wiring layer 113 may be formed on the carrier board 107 and the connection element 114 may be formed on the wiring layer 113. The wiring layer 113 and the connection element 114 may be used to lead the electrical signal of the metal bump 102 to the functional surface of the semiconductor chip 160, which may facilitate to connect solder ball or any other chip, to achieve diverse functions of the packaging structure.

The materials of the wiring layer 113 and the connection element 114 may include metal, or a conductive semiconductor material (e.g., silicon or germanium). The quantities of the wiring layers 113 and the connection elements 114 may be determined according to the need of the packaging structure.

Further, an isolation layer 122 may be formed on the surface of the carrier board 107. The material of the isolation layer 122 may include silicon oxide, silicon nitride, resin, or any other isolation and insulation material. The wiring layer 113 may be located in the isolation layer 122. The isolation layer 122 may at least expose a partial surface of the wiring layer 113. A height of the connection element 114 may need to be equal to or slightly greater than a height of the semiconductor chip adhered to the carrier board.

The non-functional surface of the semiconductor chip 160 may be adhered to the surface of the carrier board 107 by an adhesive layer. The non-functional surface of the semiconductor chip 160 may face toward an adhesive surface of the carrier board 107. The plurality of semiconductor chips 160 may be uniformly adhered to the carrier board 107 in rows and columns.

The adhesive layer may be made of various materials. In one embodiment, the adhesive layer may be made of an UV glue. The UV glue may be a kind of glue material that can be reacted under irradiation of ultraviolet light of special wavelength. The UV glue may be divided into two types according to the change in viscosity after irradiation of ultraviolet light. One kind of the UV glue may be an UV curing glue, that is, the photoinitiator or photosensitizer in the material may absorb ultraviolet light under radiation of ultraviolet light to produce active radicals or cations, which may initiate monomer polymerization, cross-linking and graft chemical reactions to enable the UV curing glue to change from liquid to solid within a few seconds, thereby bonding the surfaces of objects being in contact. Another kind of the UV glue may have substantially high viscosity when not exposed to UV light, and after being exposed to ultraviolet light, the cross-linking chemical bonds in the UV glue may be broken, which may cause the viscosity to significantly decrease or even disappear. The UV glue used for the adhesive layer here may be the latter one. The adhesive layer may be formed by a film-sticking process, a glue-printing process, or a glue-rolling process.

In certain embodiments, the adhesive layer may be made of epoxy glue, polyimide glue, polyethylene glue, benzocyclobutene glue, or polybenzoxazole glue.

Referring to FIG. 66 or FIG. 67, a second encapsulation layer 109 may be formed on the carrier board 107 to cover the first encapsulation layer 103 on the functional surface and the sidewall surface of the semiconductor chip 160 and the connection element 114.

The second encapsulation layer 109 may be used to seal and fix the semiconductor chip 160. The second encapsulation layer 109 may also cover the surface of the carrier board 107.

The material of the second encapsulation layer 109 may include one or more of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate, and polyvinyl alcohol. The second encapsulation layer 109 may be formed by an injection molding process, a transfer molding process, or any other suitable process.

Referring to FIG. 68 (on the basis of FIG. 66) or in combination with FIG. 69 (on the basis of FIG. 67) and FIG. 70 (on the basis of FIG. 69), a portion of the first encapsulation layer 103 and the second encapsulation layer 109 on the carrier board 107 may be removed by a planarization process, to expose the top surface of the metal bump 102.

In one embodiment, when the isolation sacrificial layer is not formed, the portion of the first encapsulation layer 103 and the second encapsulation layer 109 on the carrier board 107 may be directly removed by a chemical mechanical polishing process to expose the metal bump 102.

When directly removing the portion of the first encapsulation layer 103 and the second encapsulation layer 109 on the carrier board 107 by a chemical mechanical polishing process, because the formed first encapsulation layer 103 well covers the metal bump 102, and the first encapsulation layer 103 at a different position on the functional surface of the semiconductor chip 160 has uniform density and hardness, the first encapsulation layer 103 may well prevent the metal bump 102 from detaching or being shifted from the surface of the pad 101 during the polishing process. Further, the first encapsulation layer 103 may prevent the metal bump 102 from being over-polished. When subsequently forming a rewiring layer on the planarized first encapsulation layer 103 and the second encapsulation layer 109, the connection position of the rewiring layer and the metal bump 102 may not be shifted, thereby improving the electrical connection performance between the rewiring layer and the pad in the packaging structure.

In another embodiment, when the isolation sacrificial layer 120 is formed, referring to FIG. 69, the portion of the first encapsulation layer 103 and the second encapsulation layer 109 may be first removed by a chemical mechanical polishing process to expose the surface of the isolation sacrificial layer 120. Referring to FIG. 70, the isolation sacrificial layer 120 (referring to FIG. 69) on the top surface of the metal bump 102 may be removed by an etching process to expose the top surface of the metal bump 102.

In one embodiment, an opening 121 in the first encapsulation layer 103 may be formed at a corresponding position for removing the isolation sacrificial layer 120, and the opening 121 may expose the top surface of the metal bump 102. In the present disclosure, by forming the isolation sacrificial layer 120, the portion of the first encapsulation layer and the second encapsulation layer may be removed by a chemical mechanical polishing process to expose the surface of the isolation sacrificial layer. The isolation sacrificial layer on the top surface of the metal bump 102 may be removed by an etching process to expose the top surface of the metal bump 102.

Therefore, through the combination of the aforementioned specific structure and specific process, not only the top surface of the metal bump may be exposed, but also when removing the portion of the first encapsulation layer and the second encapsulation layer by a chemical mechanical polishing process, the exposed surface may be the surface of the isolation sacrificial layer. Thus, the polishing pad in the polishing equipment may not contact the metal bump, and may not bring polishing force to the metal bump. Therefore, the metal bump 102 may be prevented from being loosened or coming off from the pad 101, which may further improve the accuracy of the connection position between the subsequently formed rewiring layer and the corresponding metal bump, and may further improve the electrical connection performance between the rewiring layer and the metal bump 102.

The etching process for removing the isolation sacrificial layer 120 may include a wet etching process or a dry etching process. In one embodiment, when the isolation sacrificial layer 120 is made of silicon nitride, the isolation sacrificial layer 120 may be removed by a wet etching process, and an etching solution used in the wet etching process may include a phosphoric acid solution.

Referring to FIG. 71 (on the basis of FIG. 68) and FIG. 72, an external contact structure connected to the metal bump 102 may be formed on the surface of the planarized first encapsulation layer 103 and the second encapsulation layer 109. The external contact structure may be connected to the connection element 114.

The external contact structure may include a rewiring layer 110 located on the surface of the planarized first encapsulation layer 103 and the second encapsulation layer 109 and connected to the metal bump 102, and an external contact element 112 located on the rewiring layer 110 and connected to the rewiring layer 110. The metal bump 102 on each semiconductor chip 160 may be connected to a corresponding external contact structure. In one embodiment, the external contact element 112 may be a solder ball. In another embodiment, the external contact element 112 may include a metal pillar and a solder ball located on the surface of the metal pillar.

In one embodiment, the process of forming the rewiring layer 110 and the external contact element 112 may include following. The rewiring layer 110 may be formed on the surface of the planarized first encapsulation layer 103 and the second encapsulation layer 109. An insulating layer 111 may be formed on the rewiring layer 110 and the surface of the planarized first encapsulation layer 103 and the second encapsulation layer 109. The insulating layer 111 may have an opening that exposes a partial surface of the rewiring layer 110. The material of the insulating layer 111 may include silicon nitride, borosilicate glass, phosphorous silicate glass, or borophosphosilicate glass. The external contact element 112 may be formed in the opening.

It should be noted that the process of forming the external contact structure on the basis of FIG. 70 may be substantially the same as the process of forming the external contact structure in FIGS. 71-72, and details may not be repeated herein.

Figure 73:
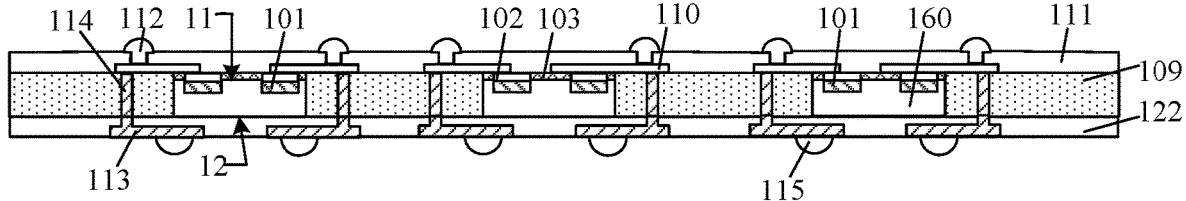

Referring to FIG. 73, after forming the external contact structure, the carrier board (referring to FIG. 72) may be peeled off. A solder ball 115 or a chip (not illustrated) connected to the wiring layer 113 may be formed on the wiring layer 113. The solder ball 115 may be used to connect other semiconductor chips.

In one embodiment, the chip may be a heterogeneous chip, and pads may be formed on the chip. When the chip is connected to the wiring layer 113, the chip may be flip-mounted on the surface of the isolation layer 122, and the pad on the chip may be connected to the wiring layer. In certain embodiments, the back surface of the chip may be adhered to the surface of the isolation layer 122, and the pads on the chip and the wiring layer 113 may be connected by wires.

The adhesive layer may be removed by chemical etching, mechanical peeling, chemical mechanical polishing (CMP), mechanical grinding, thermal baking, etc., such that the carrier board 107 may be peeled off.

Figure 74:
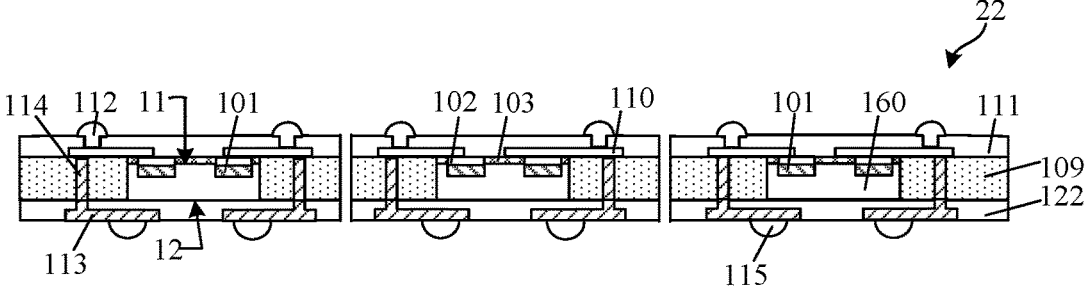

Referring to FIG. 74, after forming the solder ball 115 or the chip connected to the wiring layer 113, a plurality of discrete packaging structures 22 may be formed by performing a cutting process.

Exemplary Embodiment 8

The present disclosure also provides a packaging structure. Referring to FIG. 66 or FIG. 67, the packaging structure may include a carrier board 107, a plurality of wiring layers 113 formed on the surface of the carrier board 107, and a connection element 114 formed on the wiring layer 113. The packaging structure may also include a plurality of semiconductor chips 160 adhered to a surface of the carrier board 107 on which the connection element 114 is formed. Each semiconductor chip 160 may have a functional surface 11 and a non-functional surface 12 opposite to the functional surface 11. A plurality of pads 101 may be formed on the functional surface 11. A metal bump 102 may be formed on the surface of a pad 101 of the plurality of pads 101. A first encapsulation layer 103 may be formed over the functional surface 11. The first encapsulation layer 103 may cover the metal bump 102. The non-functional surface of the semiconductor chip 160 may be adhered to the carrier board 107.

In addition, the packaging structure may include a second encapsulation layer 109 formed on the carrier board 107 and covering the connection element 114 and the first encapsulation layer on the functional surface and the sidewall surface of the semiconductor chip 160.

In one embodiment, the semiconductor chip 160 may be formed by an integrated manufacturing process. A wafer may be provided, and the plurality of semiconductor chips may be formed on the wafer. Each semiconductor chip may include the functional surface, and the plurality of pads may be formed on the functional surface. The metal bump may be formed on the pad. The first encapsulation layer may be formed to cover the metal bump and the functional surface. After forming the first encapsulation layer, the wafer may be cut to form the plurality of discrete semiconductor chips.

In one embodiment, the material of the first encapsulation layer 103 and the second encapsulation layer 109 may include resin. The process of forming the first encapsulation layer and the second encapsulation layer may include an injection molding process or a transfer molding process.

In one embodiment, the size of the material particle in the first encapsulation layer 103 may be smaller than the size of the material particle in the second encapsulation layer 109.

In one embodiment, referring to FIG. 67, the packaging structure may also include an isolation sacrificial layer 120 formed on the top surface or the top and sidewall surfaces of the metal bump 102. The first encapsulation layer 103 may further cover the isolation sacrificial layer 120. The material of the isolation sacrificial layer 120 may include silicon oxide, silicon nitride, or silicon oxynitride.

It should be noted that the same or similar structures of the packaging structure may not be repeated herein, and details may refer to the definitions or descriptions of corresponding parts in the method of forming the packaging structure.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A packaging structure, comprising:
a carrier board;
a plurality of semiconductor chips, adhered to the carrier board, wherein each semiconductor chip has a functional surface and a non-functional surface opposite to the functional surface, a plurality of pads are formed on the functional surface of a semiconductor chip of the plurality of semiconductor chips, a metal bump is formed on a surface of a pad of the plurality of pads, and a first encapsulation layer is formed on the functional surface; and
a second encapsulation layer, formed over the carrier board,
wherein an interface between a first surface of the first encapsulation layer and the functional surface of the semiconductor chip is coplanar with an interface between a first surface of the metal bump and the pad on which the metal bump is formed, and
wherein a second surface of the first encapsulation layer protrudes over a second surface of the metal bump, providing a first opening between sidewalls of the first encapsulation layer and exposing the second surface of the metal bump at a bottom of the first opening.

2. The packaging structure according to claim 1, wherein:
the first encapsulation layer on the functional surface of the semiconductor chip is adhered to the carrier board, or
the non-functional surface of the semiconductor chip is adhered to the carrier board.

3. The packaging structure according to claim 1, wherein:
the second encapsulation layer covers the non-functional surface and a sidewall surface of the semiconductor chip; or
the second encapsulation layer covers the first encapsulation layer on the functional surface, and a sidewall surface of the semiconductor chip.

4. The packaging structure according to claim 1, wherein:
the first encapsulation layer and the second encapsulation layer are made of a material including resin.

5. The packaging structure according to claim 4, wherein:
the first encapsulation layer has a material particle smaller
than the second encapsulation layer.

6. The packaging structure according to claim 1, further
including:
an isolation sacrificial layer, formed on a top surface or on
top and sidewall surfaces of the metal bump, wherein
a material of the isolation sacrificial layer includes
silicon oxide, silicon nitride, or silicon oxynitride.

7. The packaging structure according to claim 6, wherein:
the first encapsulation layer covers the isolation sacrificial
layer; or
a surface of the first encapsulation layer is coplanar with
a surface of the isolation sacrificial layer.

8. The packaging structure according to claim 1, further
comprising:
an external contact structure connected to the metal bump,
wherein the external contact structure includes a rewir-
ing layer connected to the metal bump, and an external
contact element located on the rewiring layer and
connected to the rewiring layer; and
an insulating layer formed on the rewiring layer, wherein
the insulating layer is provided with a second opening
that exposes a partial surface of the rewiring layer, and
the external contact element is formed in the second
opening.

9. The packaging structure according to claim 1, further
comprising:
a plurality of wiring layers formed on the surface of the
carrier board, wherein a connection element formed on
the wiring layer; and
an external contact structure connected to the metal bump
and the connection element, wherein the external con-
tact structure includes a rewiring layer connected to the
metal bump, and an external contact element located on
the rewiring layer and connected to the rewiring layer.

10. The packaging structure according to claim 1, wherein
the metal bump is a single integral structure including an
under-bump metal (UBM) layer in contact with the surface
of the pad.

11. A method for forming a packaging structure, compris-
ing:
providing a plurality of semiconductor chips, wherein
each semiconductor chip of the plurality of semicon-
ductor chips includes a functional surface and a non-
functional surface opposite to the functional surface, a
plurality of pads are formed on the functional surface,
a metal bump is formed on a surface of a pad of the
plurality of pads, an isolation sacrificial layer is formed
on the metal bump, and a first encapsulation layer is
formed on the functional surface and envelops both the
isolation sacrificial layer and the metal bump;
providing a carrier board;
adhering the first encapsulation layer on the functional
surface of the each semiconductor chip to the carrier
board;
forming a second encapsulation layer on the carrier board
to cover the non-functional surface and a sidewall
surface of a semiconductor chip of the plurality of
semiconductor chips;
forming a pre-encapsulation panel by peeling off the
carrier board, wherein a back side of the pre-encapsu-
lation panel exposes the first encapsulation layer;
removing a portion of the first encapsulation layer and the
second encapsulation layer on the back side of the
pre-encapsulation panel, followed by removing the isolation sacrificial layer to expose a surface of the
metal bump at the back side of the pre-encapsulation
panel, wherein
an interface between a first surface of the first encap-
sulation layer and the functional surface of the
semiconductor chip is coplanar with an interface
between a first surface of the metal bump and the pad
on which the metal bump is formed, and
a second surface of the first encapsulation layer pro-
trudes over the exposed surface of the metal bump,
providing a first opening between sidewalls of the
first encapsulation layer with the exposed surface of
the metal bump at a bottom of the first opening,
wherein
the metal bump on the back side of the pre-encapsu-
lation panel is configured to electrically connect to
an external contact structure.

12. The method according to claim 11, wherein:
the semiconductor chip is formed by an integrated manu-
facturing process.

13. The method according to claim 11, wherein:
the first encapsulation layer and the second encapsulation
layer are formed by one of an injection molding process
or a transfer molding process.

14. The method according to claim 11, wherein:
removing the portion of the first encapsulation layer and
the second encapsulation layer on the back side of the
pre-encapsulation panel includes a chemical mechani-
cal polishing process.

15. The method according to claim 11, wherein:
the first encapsulation layer covers the isolation sacrificial
layer; or
a surface of the first encapsulation layer is coplanar with
a surface of the isolation sacrificial layer.

16. The method according to claim 11, further including:
removing the portion of the first encapsulation layer and
the second encapsulation layer on the back side of the
pre-encapsulation panel by a chemical mechanical pol-
ishing process to expose a surface of the isolation
sacrificial layer; and
removing the isolation sacrificial layer on the top surface
of the metal bump by an etching process to expose the
top surface of the metal bump.

17. The method according to claim 11, further including:
cutting the pre-encapsulation panel to form a plurality of
discrete packaging structures.

18. A method for forming a packaging structure, com-
prising:
providing a plurality of semiconductor chips, wherein
each semiconductor chip of the plurality of semicon-
ductor chips includes a functional surface and a non-
functional surface opposite to the functional surface, a
plurality of pads are formed on the functional surface,
a metal bump is formed on a surface of a pad of the
plurality of pads, an isolation sacrificial layer is formed
on the metal bump, and a first encapsulation layer is
formed on the functional surface and envelops both the
isolation sacrificial layer and the metal bump;
providing a carrier board;
adhering the non-functional surface of the each semicon-
ductor chip to the carrier board;
forming a second encapsulation layer on the carrier board
to cover the first encapsulation layer on the functional
surface, and a sidewall surface of a semiconductor chip
of the plurality of semiconductor chips;
removing a portion of the first encapsulation layer and the
second encapsulation layer over the carrier board by a planarization process, followed by removing the isolation sacrificial layer to expose a surface of the metal bump, wherein an interface between a first surface of the first encapsulation layer and the functional surface of the semiconductor chip is coplanar with an interface between a first surface of the metal bump and the pad on which the metal bump is formed, and a second surface of the first encapsulation layer protrudes over the exposed surface of the metal bump, providing a first opening between sidewalls of the first encapsulation layer with the exposed surface of the metal bump at a bottom of the first opening;

forming an external contact structure connected to the metal bump on a surface of the planarized first encapsulation layer and the second encapsulation layer; and peeling off the carrier board.

19. The method according to claim 18, before adhering the non-functional surface of the each semiconductor chip to the carrier board, further including:

forming a plurality of wiring layers on a surface of the carrier board, and forming a connection element on a wiring layer of the plurality of wiring layers.

20. The method according to claim 19, further including:

adhering the non-functional surface of the each semiconductor chip to the surface of the carrier board on which the connection element is formed, forming the second encapsulation layer on the carrier board to cover the sidewall surface of the semiconductor chip, the first encapsulation layer on the functional surface, and the connection element, removing the portion of the first encapsulation layer and the second encapsulation layer over the carrier board by the planarization process to expose the top surface of the metal bump, and forming the external contact structure connected to the metal bump on the surface of the planarized first encapsulation layer and the second encapsulation layer, wherein the external contact structure is connected to the connection element.

\* \* \* \* \*